United States Patent
Aruga et al.

(10) Patent No.: US 7,378,790 B2
(45) Date of Patent: May 27, 2008

(54) COLOR DISPLAY SUBSTRATE, COLOR FILTER SUBSTRATE, COLOR LUMINESCENT SUBSTRATE, MANUFACTURING METHOD OF COLOR DISPLAY SUBSTRATE, ELECTRO-OPTICAL APPARATUS, ELECTRONIC DEVICE, FILM-FORMING METHOD, FILM-FORMING APPARATUS, AND DISPLAY MOTHERBOARD

(75) Inventors: Hisashi Aruga, Fujimi-machi (JP);
Satoru Katagami, Hara-mura (JP);
Yoshiaki Yamada, Shimosuwa-machi (JP); Hiroshi Kiguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 132 days.

(21) Appl. No.: 10/131,472

(22) Filed: Apr. 25, 2002

(65) Prior Publication Data
US 2002/0167268 A1 Nov. 14, 2002

(30) Foreign Application Priority Data

May 2, 2001 (JP) ............................ 2001-134875
Mar. 27, 2002 (JP) ............................ 2002-087601

(51) Int. Cl.
*H01J 1/62* (2006.01)
*H01J 63/04* (2006.01)

(52) U.S. Cl. .................. 313/500; 313/506; 313/112

(58) Field of Classification Search ........ 313/500–502, 313/506, 112; 349/156, 104, 106, 108
See application file for complete search history.

(56) References Cited

U.S. PATENT DOCUMENTS 4,986,637 A * 1/1991 Yamaguchi ................. 349/109
5,058,992 A 10/1991 Takahashi
5,565,742 A * 10/1996 Shichao et al. ............. 315/366
5,959,704 A 9/1999 Suzuki et al. ............... 349/106
6,023,315 A * 2/2000 Harrold et al. ............. 349/108
6,052,161 A * 4/2000 Yamada et al. ............... 349/32
6,147,728 A 11/2000 Okumura et al. ............... 349/9
6,559,910 B2 * 5/2003 Suzuki et al. ................. 349/95
6,859,296 B2 * 2/2005 Kawase ....................... 359/237
2002/0050958 A1 * 5/2002 Matthies et al. ............... 345/55

FOREIGN PATENT DOCUMENTS

| JP | A-59-75205 | 4/1984 |
| JP | A-02-072320 | 3/1990 |
| JP | A-08-271724 | 10/1996 |

(Continued)

*Primary Examiner*—Nimeshkumar D. Patel
*Assistant Examiner*—Kevin Quarterman
(74) *Attorney, Agent, or Firm*—Oliff & Berridge, PLC

(57) ABSTRACT

The invention provides a color display substrate having plural color display elements arranged in a matrix pattern, and a manufacturing method to efficiently obtain a color filter substrate and color luminescent substrate, for example. A manufacturing method of a color display substrate includes the step of forming plural color dots by selectively ejecting liquid droplets from nozzles in accordance with input data. The plural color dots constitute plural pixels, which constitute plural color filter elements arranged in a matrix pattern. The plural color dots have a first dot pitch in a direction perpendicular to a first base line. Each of the plural color dots is formed to lie at a distance of at least substantially an integral multiple of the first dot pitch from the first base line.

61 Claims, 17 Drawing Sheets

FOREIGN PATENT DOCUMENTS

| | | |
|---|---|---|
| JP | A-11-074076 | 3/1999 |
| JP | A-11-250486 | 9/1999 |
| JP | A-2000-323276 | 11/2000 |
| JP | 2001-116916 A | 4/2001 |
| KR | 10-0246081 | 3/2000 |
| KR | 10-0258290 | 6/2000 |

\* cited by examiner

FIG. 4
(A)
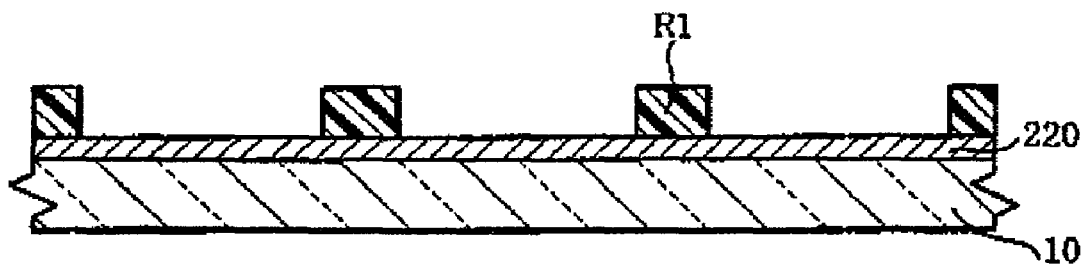
(B)
(C)
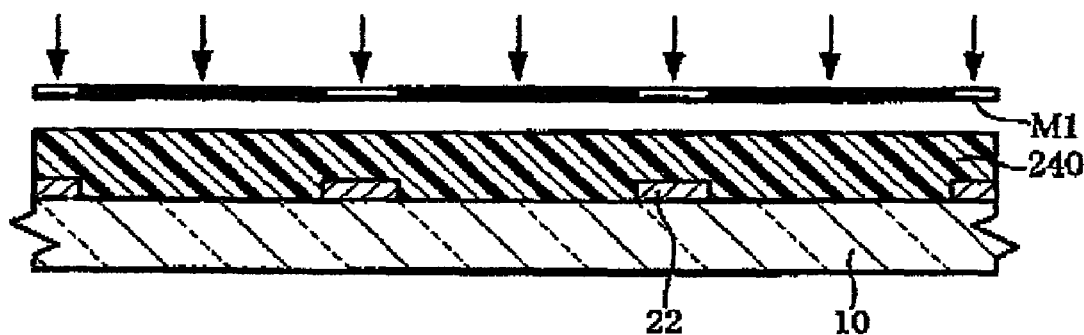
(D)
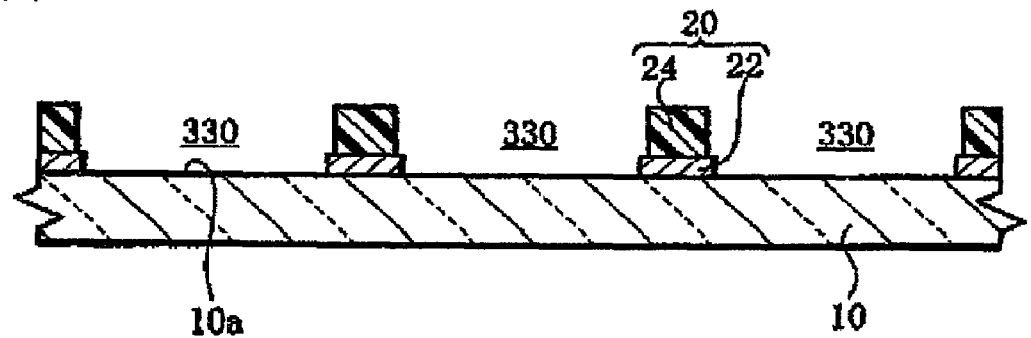

FIG. 5
(A)
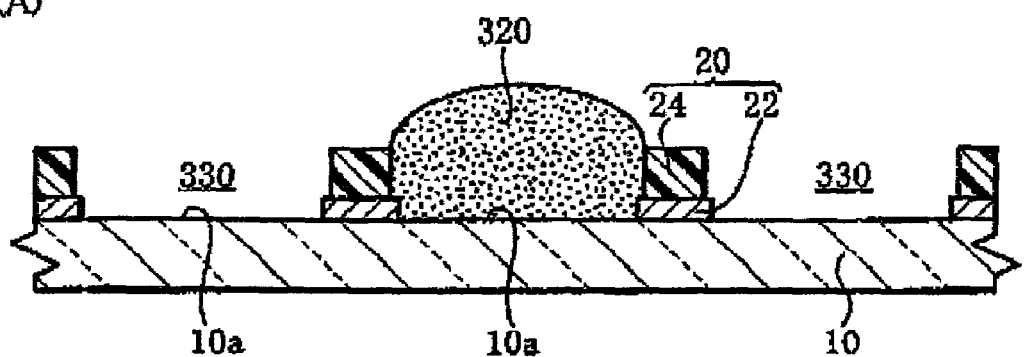
(B)
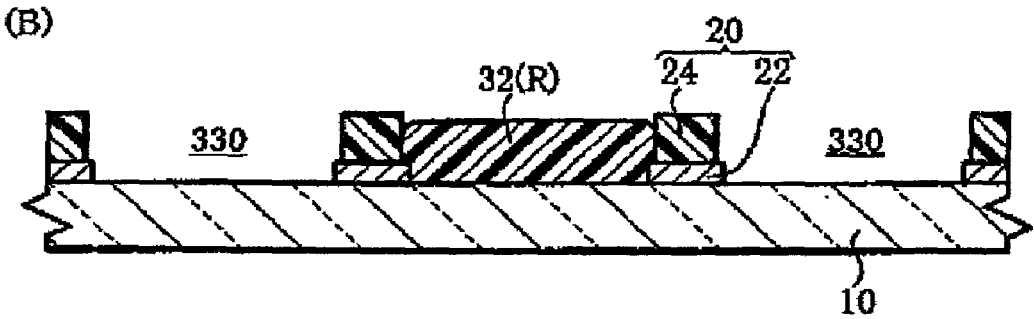
(C)
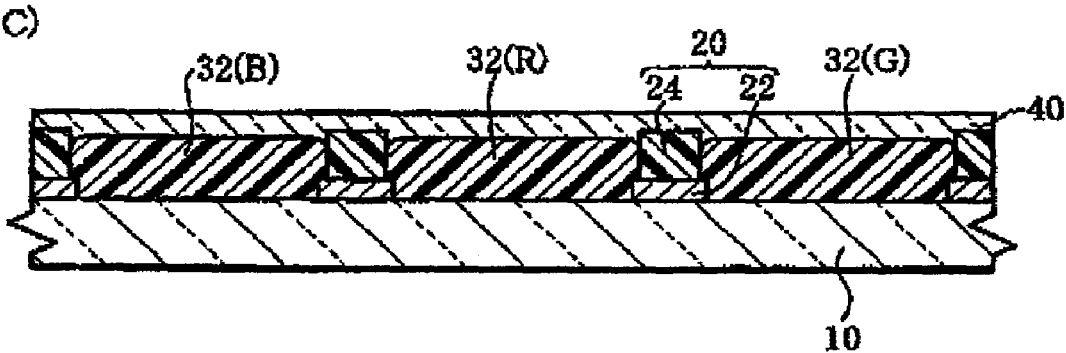
(D)
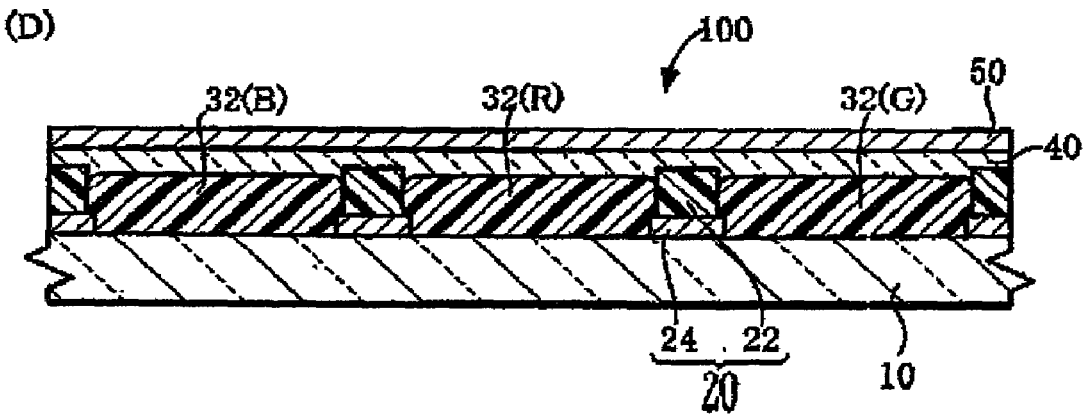

FIG. 10
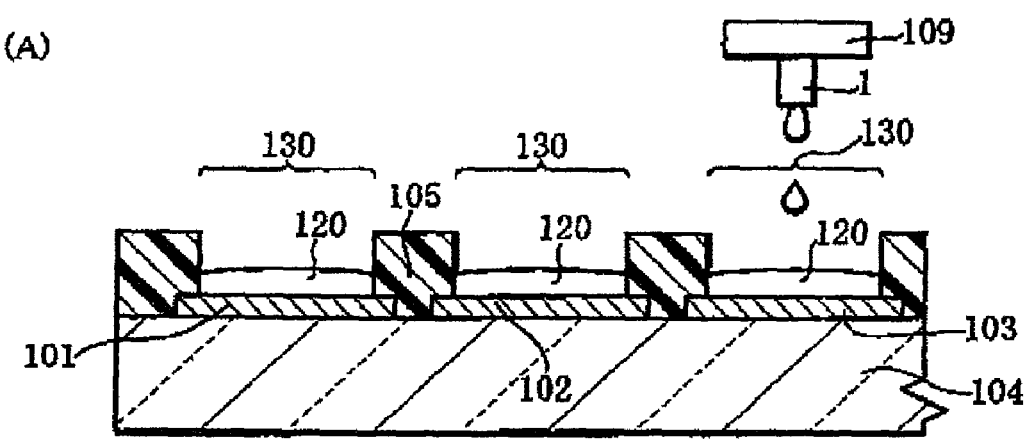
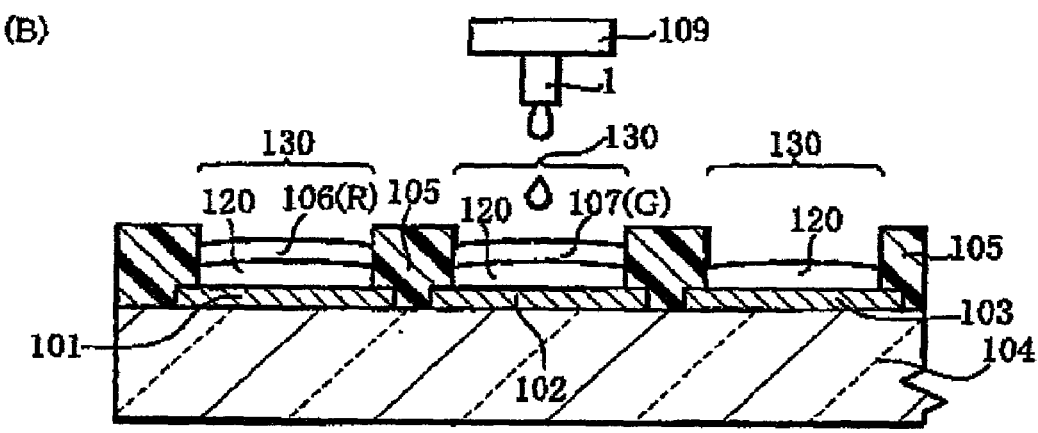
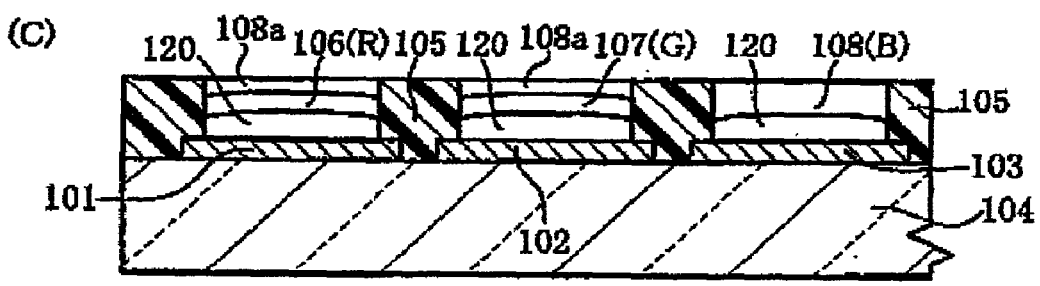
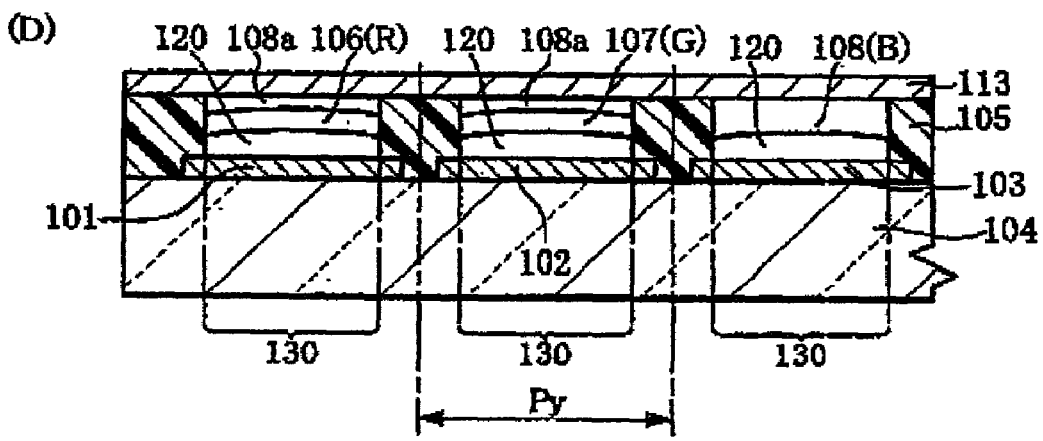

FIG. 15
(A)
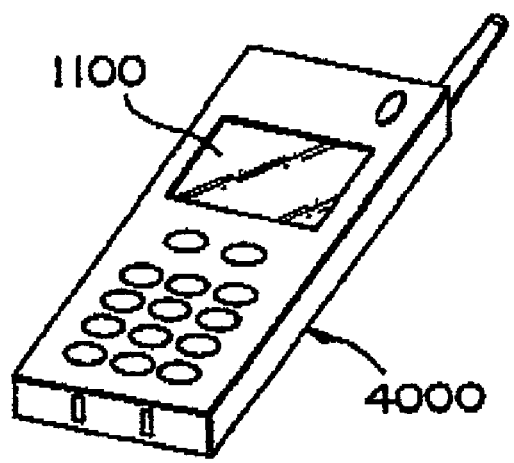
(B)
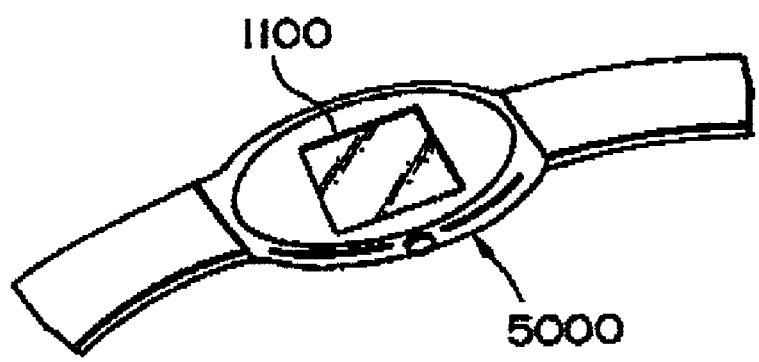
(C)
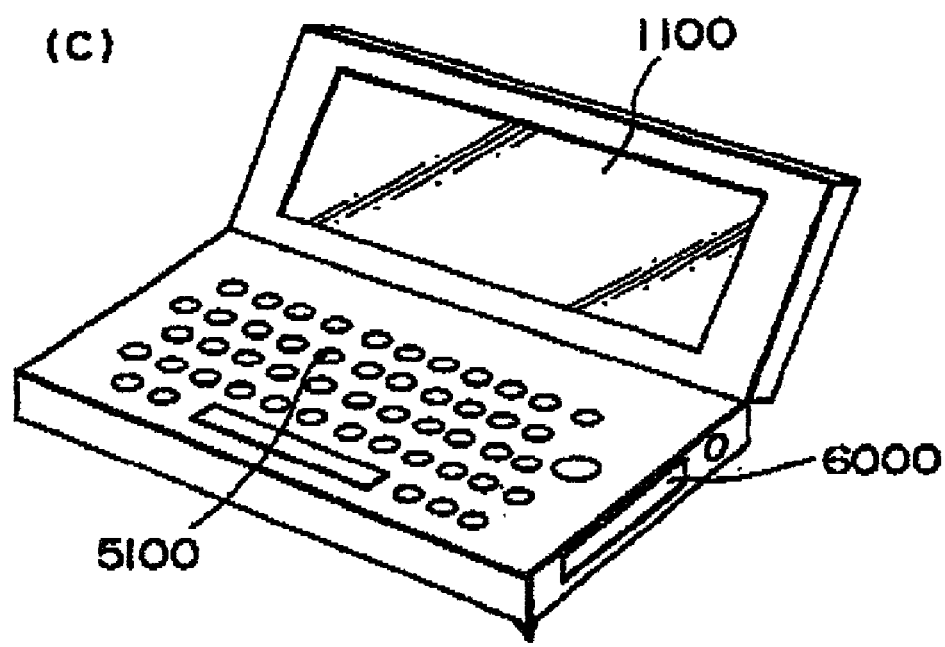

COLOR DISPLAY SUBSTRATE, COLOR
FILTER SUBSTRATE, COLOR
LUMINESCENT SUBSTRATE,
MANUFACTURING METHOD OF COLOR
DISPLAY SUBSTRATE, ELECTRO-OPTICAL
APPARATUS, ELECTRONIC DEVICE,
FILM-FORMING METHOD, FILM-FORMING
APPARATUS, AND DISPLAY
MOTHERBOARD

BACKGROUND OF THE INVENTION

1. Field of Invention

The present invention relates to a color display substrate, a color filter substrate, a color luminescent substrate, a manufacturing method of the color display substrate, an electro-optical apparatus, an electronic device, a film-forming method, a film-forming apparatus, and a display motherboard.

2. Description of Related Art

Recently, along with advancements in personal computers, especially in portable personal computers and portable information devices, the demand for liquid crystal color displays has strongly increased. Accordingly, an urgent need exists to establish a method of providing an excellent display at a fair price. In order to provide environmental protection, conversion into, and enhancement of, methods to reduce environmental loading are also demanded.

The following is a related art method for manufacturing a color filter.

In the method, first, a chrome thin film is patterned by photolithography and etching so as to form black matrixes as light shielding material. Then, after coating clearances between the black matrixes with red, green, and blue photoresists, a spin coating method is performed for each color, and patterning is performed by photolithography. Thereby, color matrixes, in which red, green, and blue colored layers (color dots) are arranged to be adjacent to one another, are formed. In this manufacturing method, the photolithography process has to be repeated for each color, and since an unnecessary portion is removed for patterning each color, losses in a photoresist are produced, resulting in a color filter with high cost and high environmental loading.

Thus, as a method for addressing or solving the problem of such a manufacturing method, a method employing an inkjet technique is proposed in Japanese Unexamined Patent Application Publication No. 59-75205, for example. According to this method, after partitions are created on a transparent substrate in matrix arrangements so as to define a color-dot-forming region with a material with low wettability to ink, the color dot is formed by coating within the partition with a non-photosensitive color material by the inkjet technique. In this method, the complexity of the photolithography process can be eased, and also losses in color material can be reduced. Various other related art manufacturing methods employing a process of coating with the non-photosensitive color material by the inkjet technique have also been proposed.

SUMMARY OF THE INVENTION

The present invention provides a manufacturing method capable of efficiently obtaining a color display substrate having a plurality of color display elements arranged in matrix arrangements, such as a color filter substrate and color-luminescent substrate.

The present invention also provides a color display substrate manufactured by the manufacturing method mentioned above, such as a color filter substrate and color luminescent substrate.

The present invention further provides an electro-optical apparatus and electronic device having a color indicator obtained from the color display substrate mentioned above.

A color display substrate according to the present invention includes a plurality of color display elements arranged in a matrix pattern, a plurality of pixels that constitute each of the plurality of color display elements, and a plurality of color dots that constitute each of the plurality of pixels.

The plurality of color dots have a first dot pitch in a direction perpendicular to a first base line.

Each of the plurality of color dots is located at a distance of at least substantially an integral multiple of the first dot pitch from the first base line.

The color display substrate can be efficiently obtained by a manufacturing method, which will be described below.

The color display substrate according to the present invention may have various other features as follows.

(A) The color dots of the color display elements may further be located at a distance of substantially an integral multiple of a second dot pitch in a direction perpendicular to a second base line from the second base line perpendicular to the first base line.

(B) The spacing between the color display elements may be substantially an integral multiple of the second dot pitch in the direction of the first base line while being substantially an integral multiple of the first dot pitch in the direction of the second base line. By such a setting, the color element pitch can be prescribed as substantially an integral multiple of the first and second dot pitches. That is, from viewpoint of the color element pitch, the arrangement pitch of the color elements is substantially an integral multiple of the second dot pitch in the direction of the first base line while being substantially an integral multiple of the first dot pitch in the direction of the second base line.

(C) The arrangement of the pixels of the color display elements may be any one of a stripe type, a mosaic type, a delta type, and a square type.

(D) The color dots may be formed of liquid droplets ejected from nozzles, and the color dots may include a color display layer and a bank layer to lay out a colored layer. The bank layer serves as a partition to bank up the liquid droplet ejected from the nozzle.

A color display substrate according to the present invention is applicable to various display substrates capable of color displaying with the three primary colors of red, green, and blue. A color filter substrate and a color luminescent substrate are examples of typical display substrates.

For example, the color filter substrate according to the present invention includes a plurality of color filter elements arranged in a matrix pattern, a plurality of pixels that constitute each of the plurality of color filter elements, and a plurality of color dots that constitute each of the plurality of pixels.

The plurality of color dots have a first dot pitch in a direction perpendicular to a first base line.

Each of the plurality of color dots is located at a distance of at least substantially an integral multiple of the first dot pitch from the first base line.

A color luminescent substrate according to the present invention includes a plurality of color luminescent elements arranged in a matrix pattern, a plurality of pixels that constitute each of the plurality of color luminescent elements, and a plurality of color dots that constitute each of the plurality of pixels.

The plurality of color dots have a first dot pitch in a direction perpendicular to a first base line.

Each of the plurality of color dots is located at a distance of at least substantially an integral multiple of the first dot pitch from the first base line.

A method for manufacturing a color display substrate according to the present invention includes the step of forming a plurality of color dots by selectively ejecting liquid droplets from nozzles in accordance with input data.

The plurality of color dots constitute a plurality of pixels.

The plurality of pixels constitute a plurality of color display elements.

The plurality of color display elements are arranged in a matrix pattern.

The plurality of color dots have a first dot pitch in a direction perpendicular to a first base line.

Each of the plurality of color dots is located at a distance of at least substantially an integral multiple of the first dot pitch from the first base line.

According to the manufacturing method, each color-dot forming-region constituting the color display element is located at a distance of at least substantially an integral multiple of the first dot pitch in a direction perpendicular to a first base line from the first base line, so that positional data of the color-dot forming-region can be prescribed by the first dot pitch, facilitating the design.

An inkset system may be used as a method to selectively eject the liquid droplets from nozzles, for example.

The manufacturing method according to the present invention may have various other features as follows.

(A) The region where the color dots are formed of the color display element may be located at a distance of substantially an integral multiple of a second dot pitch in a direction perpendicular to a second base line from the second base line perpendicular to the first base line. By such a setting, not only from the first base line but also from the second base line, positional data of the color-dot forming-region can be prescribed by the second dot pitch, facilitating the design.

(B) The spacing between the color display elements may be substantially an integral multiple of the second dot pitch in the direction of the first base line while being substantially an integral multiple of the first dot pitch in the direction of the second base line. By such setting, the pitch of the color display elements can be prescribed by the first and second dot pitches. The arrangement of the color display elements can be set to be substantially an integral multiple of the second dot pitch in the direction of the first base line while being substantially an integral multiple of the first dot pitch in the direction of the second base line.

(C) The method further includes the steps of forming a bank layer to lay out a color display layer of the color dots, and supplying liquid droplets to a region laid out by the bank layer. The bank layer serves as a partition to bank up the liquid droplets ejected from the nozzles.

(D) The head for the ejecting liquid droplets has a nozzle array having a plurality of nozzles, which are arranged linearly so as to have a predetermined pitch in the direction of the first base line, and the nozzle array has an effective nozzle-array length including a plurality of regions where the color-display elements are formed. In accordance with the head for the ejecting liquid droplets having such an effective nozzle-array length, by one round of scanning, plural lines of the color display element can be formed.

Furthermore, in the nozzle array, the effective nozzle-array length in the direction of the first base line may be substantially an integral multiple of the second element pitch of the color display elements.

(E) The color display element may include the color filter element or a color luminescent element.

An electro-optical apparatus according to the present invention includes a color indicator obtained from the color display substrate according to the present invention.

An electro-optical apparatus according to the present invention includes a color filter obtained from the color filter substrate according to the present invention, an opposing substrate arranged at a predetermined distance from the color filter, and an electro-optical material layer placed between the color filter and the opposing substrate. The electro-optical material layer may be a liquid-crystal material layer.

An electro-optical apparatus includes a color illuminator obtained from a color luminescent substrate according to the present invention. The luminescent layer of the color dot may include an electroluminescence material.

An electronic device includes an electro-optical apparatus according to present invention.

A display motherboard according to the present invention includes a plurality of units, each constituting the display, and a plurality of dot elements arranged in line.

The plurality of dot elements are arranged within each of the units in a predetermined direction at a first dot pitch, and one of the plurality of dot elements included in each one of the units and one of the plurality of dot elements included in the other of the units are arranged at a distance of substantially an integral multiple of the first dot pitch in the predetermined direction.

A method for forming a film according to the present invention includes the step of forming a plurality of dot elements by selectively ejecting liquid droplets from nozzles.

The plurality of dot elements have a dot pitch in a direction perpendicular to a base line.

Each of the plurality of dot elements is located at a distance of at least substantially an integral multiple of the dot pitch from the base line.

The film-forming apparatus may include a scannable head, and a plurality of nozzles arranged in the head to eject liquid droplets.

The liquid droplets are selectively ejected from the nozzles so as to form a plurality of dot elements by scanning the head.

The plurality of dot elements are arranged in the direction of a base line while having a predetermined dot pitch in the direction of the base line.

The nozzles have an effective nozzle-array length in the direction of the base line, and the effective nozzle-array length is substantially an integral multiple of the predetermined dot pitch.

An inkjet head may be used as the scannable head, for example.

BRIEF DESCRIPTION OF THE DRAWINGS

FIGS. 4(A) to (D) are partial sectional views schematically showing manufacturing steps of the color filter substrate shown in FIGS. 1 to 3;

FIGS. 5(A) to (D) are partial sectional views schematically showing manufacturing steps of the color filter substrate shown in FIGS. 1 to 3;

FIGS. 10(A) to (D) are partial sectional views schematically showing manufacturing steps of the color luminescent substrate shown in FIGS. 8 and 9;

FIGS. 15(A) to (C) show applicable examples of electronic devices according to the present invention, where: FIG. 15(A) shows a portable telephone; FIG. 15(B) shows a wrist watch; and FIG. 15(C) shows a portable information instrument, such as a portable computer;

FIG. 16(a) is a plan view of the color filter elements; FIG. 16(b) is a sectional view taken along plane D—D of FIG. 16(a); and FIG. 16(c) is a sectional view taken along plane E—E of FIG. 16(a);

DETAILED DESCRIPTION OF PREFERRED EMBODIMENTS

First Embodiment

Figure 1:
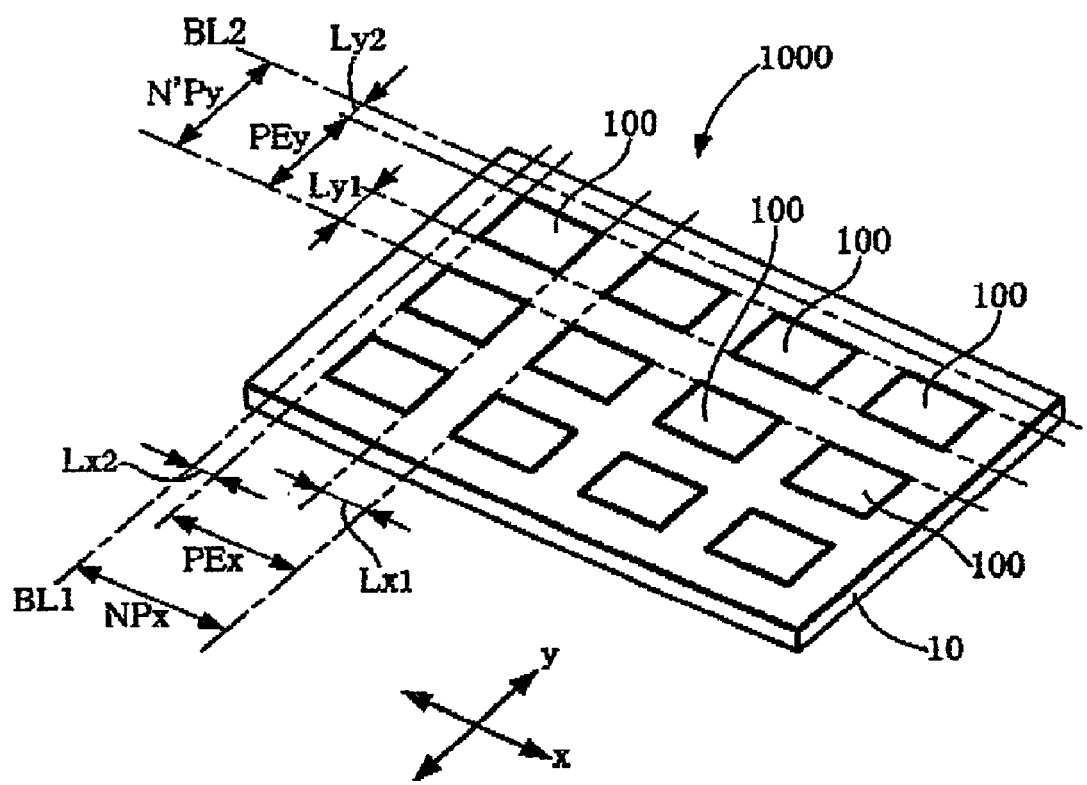
FIG. 1 is a schematic perspective view of a color filter substrate according to a first embodiment of the present invention.
Figure 2:
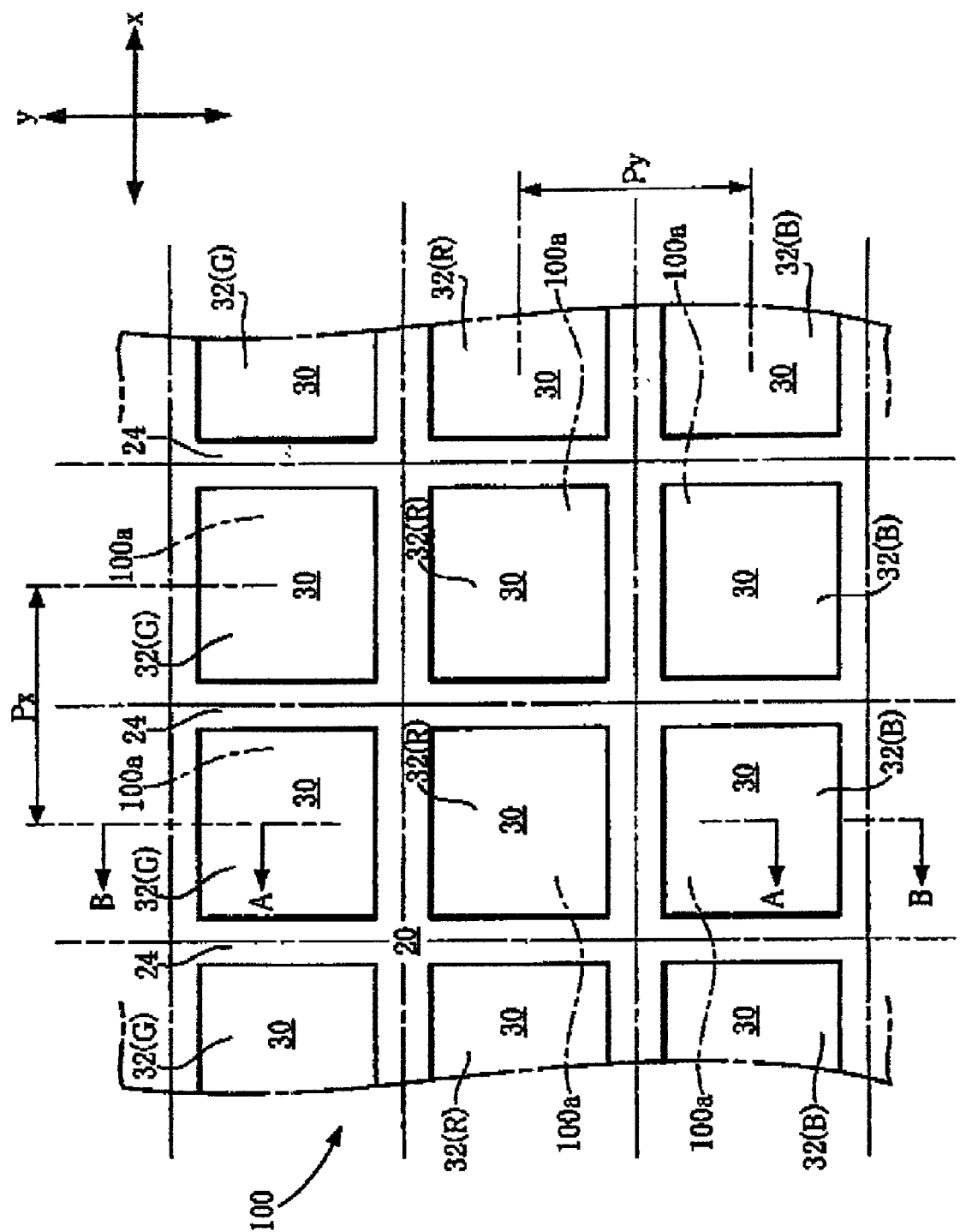
FIG. 2 is a plan view of a color filter element constituting the color filter substrate shown in FIG. 1.

FIG. 1 is a perspective view schematically showing a color filter substrate as an example of a color display substrate (display motherboard) applied in the present invention; FIG. 2 is a plan view of a significant part of a color filter element (unit constituting the display) forming the color filter substrate; and FIG. 3 is a sectional view taken along plane A—A of FIG. 2.

(Overview of Color Filter Substrate)

First, an overview of a color filter substrate 1000 will be described. The color filter substrate 1000 is of a light-transmission type and includes a transparent substrate 10 made of glass or plastic, and plural color filter elements 100 formed on the substrate 10 in matrix arrangement. Plural color filters can be obtained by cutting the color filter substrate 1000 at predetermined positions afterward.

Figure 3:
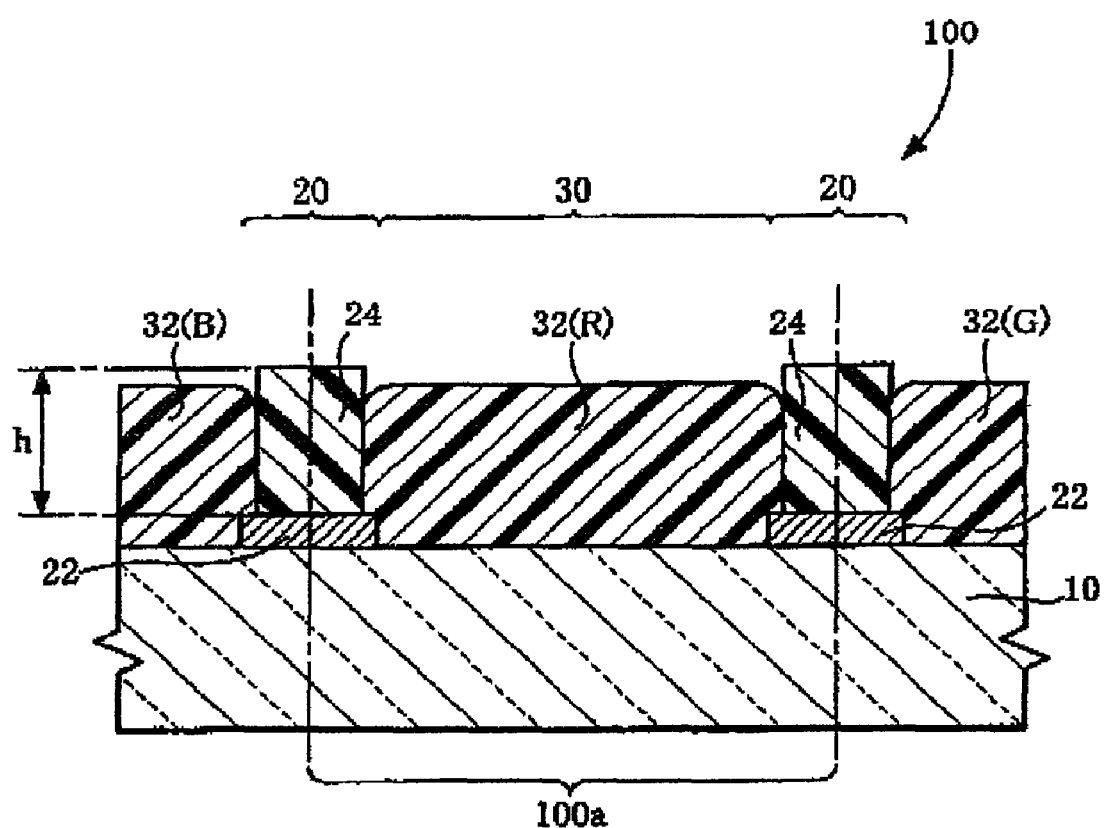
FIG. 3 is a schematic partial sectional view taken along plane A—A of FIG. 2.

The color filter element 100 according to an embodiment, as shown in FIGS. 2 and 3, includes a transparent substrate 10, a light-shielding region 20, which does not allow light (visible light) to be substantially transmitted, and a light-transmissive transmission region 30. The light-shielding region 20 includes a light-shielding layer 22 and a bank layer 24 formed on the light-shielding layer 22. The transmission region 30 is a region defined by the light-shielding region 20 and includes a colored layer 32 formed on the substrate 10.

According to the embodiment, as shown in FIG. 2, the length of one dot pitch of the colored layer 32 and the light-shielding region 20 with a predetermined width surrounding the colored layer 32 is prescribed to as one color dot (dot element) 100a. In the description below, the dot pitch of the color dots 100a forming the color filter element 100 in the X direction is referred to as a first dot pitch Px, while the dot pitch in the Y direction is referred to as a second dot pitch Py. In addition, the dot pitch, as shown in FIG. 2, is referred to as the center distance between color dots adjacent to each other.

Also, in the color filter substrate 1000, as shown in FIG. 1, the element pitch of the color filter elements 100 in the X direction is referred to as a first element pitch PEx, while the element pitch in the Y direction is referred to as a second element pitch PEy. In addition, according to the embodiment, as shown in FIG. 1, the element pitch means the distance between the sides of adjacent color filter elements. The element pitch, of course, is the same as the center distance between adjacent color filter elements, so that it may also be defined as the center distance.

The light-shielding layer 22 forming the light-shielding region 20 is formed on the substrate 10 in a predetermined pattern. The material of the light-shielding layer 22 is not specifically limited to a metal or resin, as long as it is sufficiently lightproof and functions as a black matrix. In regard to sufficient and uniform lightproof that is gained for thin film-thickness, a metal is preferable as the material of the light-shielding layer 22. The metal for use as the light-shielding layer 22 is not specifically limited so as to be selected in consideration of efficiency of the entire process including film forming and photo-etching. As such a metal, one used in electronic device processing, such as chrome, nickel, and aluminum, may be preferably used, for example.

The bank layer 24 is formed on the light-shielding layer 22 so as to have a predetermined pattern. The bank layer 24 defines regions to be formed by colored layers, and functions as a barrier to prevent adjacent colored layers from being mixed with each other (color mixture). Therefore, the film thickness of the bank layer 24 (the height h (see FIG. 3)) is established regarding the relationship to the height of an ink layer so that an ink composition (referred to as ink below) as a color material poured during forming the colored layer does not overflow. From this point of view, the range of the film thickness of the bank layer 24 may preferably be 1 to 5 µm.

The bank layer 24 is formed of a resin layer for which photolithography can be performed. Such a photosensitive resin does not necessarily need to have excellent water repellency with a large contact angle with water or to have lightproof, enabling to have wide selection. The photosensitive resin composition used as a resin for the bank layer 24 may include an urethane resin, acrylic resin, novolac resin, cardo resin, polyimide resin, polyhydroxystyrene, and polyvinyl alcohol, for example.

The colored layer 32 includes plural colored layers 32 (R), 32 (G), and 32 (B), each for red, green, and blue, which constitute the three primary colors. These colored layers 32 are arranged according to a predetermined arrangement pattern, such as striped arrangement, delta arrangement, mosaic arrangement, and square arrangement, and one pixel is constituted of continuous colored layers with three respective colors.

Features of the color filter substrate 1000 and the color filter element 100 according to the embodiment will be described below.

(Manufacturing Method of Color Filter Substrate)

Referring now to FIGS. 4(A)–5(D), an overview of a manufacturing method of the color filter will be described. FIGS. 4(A)–5(D) include sectional views of the layer structures in each step taken along plane B—B of FIG. 2.

(1) Light-Shielding Layer Forming

First, as shown in FIG. 4(A), a metallic layer 220 is deposited on the transparent substrate 10 to have a film-thickness of 0.1 to 0.5 μm by dry plating, such as sputtering, vapor deposition, and chemical deposition. As mentioned above, various metals, such as chrome, nickel, and aluminum, may be used as a material of the metallic layer 220. Then, on the surface of the metallic layer 220, a resist layer R1 having a predetermined pattern is formed by photolithography. Thereafter, patterning of the metallic layer 220 is performed using the resist layer R1 as a mask. In such a manner, as shown in FIG. 4(B), the light-shielding layer 22 having a predetermined matrix pattern is formed on the substrate 10.

(2) Bank Layer Forming

Then, as shown in FIG. 4(C), a resin layer 240 is formed on the substrate 10 having the light-shielding layer 22 formed thereon. The resin layer 240 is formed of a negative-type or positive-type resist. The resin layer 240 is made of a photo-curable type (negative type) photosensitive resin, such as an urethane resin and acrylic resin. Then, the resin layer 240 is patterned by exposure using a photo-mask M1 and by further development. The bank layer 24, as shown in FIG. 4(D), is thereby formed so as to form the light-shielding region 20. The configuration of the light-shielding region 20 has been already described so that the description is omitted. In this step, colored-layer forming regions 330 defined by the light-shielding region 20 are formed in a predetermined matrix pattern.

Next, prior to the next colored-layer forming step, surface treatment of the substrate surface is performed when necessary. Ultra-violet radiation, plasma radiation, laser beam radiation, and the like may be utilized as such surface treatment. By such surface treatment, contaminant adhering on an exposed surface 10a of the substrate 10 is removed so as to reduce a contact angle of the exposed surface 10a with water, enhancing ink wettability. More specifically, it is preferable that the difference of the contact angle with water between the exposed surface 10a of the substrate 10 and the surface of the bank layer 24 be 15° or more. By controlling the contact angle with water of the exposed surface 10a of the substrate 10 and the surface of the bank layer 24 in such a manner, ink can be applied on the exposed surface 10a of the colored-layer forming region 330 in an excellent close-contact state therewith, while being prevented from overflowing across the bank layer 24 due to the water repellency of the bank layer 24. A gas plasma method, ultra-violet radiation, and surface-active agent coating may be adopted as a surface-treatment method.

(3) Colored Layer Forming

First, as shown in FIG. 5(A), ink is applied on the colored-layer forming region 330 laid out by the light-shielding layer 22 and the bank layer 24 so as to form an ink layer 320. According to the embodiment, as an ink-applying method, an inkjet method using a printing head is applied, which is used in an inkjet printing system. As a method to form the ink layer with a high degree of accuracy on the colored-layer forming region 330 having a very small area, e.g., 50 μm square, the inkjet printing system is optimum, in which ejected ink-droplets are pulverized and moreover, the number of ejected ink-droplets can be controlled.

In order to apply the pulverized ink droplet at a target position (the exposed surface 10a of the substrate 10) with a high degree of accuracy, first, the ink-droplet in size is controlled in accordance with the size of the exposed surface 10a of the colored-layer forming region 330. It is preferable to control the size of the ink droplet, for example, to be 6 to 30 picoliter for the colored-layer forming region 330 with an area of 50 μm square. More preferably, the size of the ink-droplet may be 12 to 20 picoliter in consideration of throughput. When the ink-droplet is ejected from the inkjet printing head so as to accurately arrive the target, it is preferable that the ink-droplet be controlled to take a flight straight without being split.

According to the embodiment, the colored layer 32 is sequentially formed with respect to each color of red, green, and blue. The order of forming the colored layer 32 is not specifically limited. In an example shown in FIG. 5(B), first, the red colored layer 32(R) is formed; then, as shown in FIG. 5(C), one of the green colored layer 32(G) and the blue colored layer 32(B) is formed; and the remaining colored layer is finally formed. In addition, when selecting the color heads or plural heads of the inkjet printing system, the colored layers of red, green, and blue can be simultaneously formed.

(4) Overcoat Layer Forming

Then, as shown in FIG. 5(C), after forming the colored layer 32, an overcoat layer 40 may be formed in order to obtain a smooth surface thereon according to demand. Furthermore, as shown in FIG. 5(D), when necessary, a common electrode 50 is formed on the surface of the overcoat layer 40 so as to finish the color filter substrate 1000 having the color filter elements 100 arranged thereon in a matrix pattern. The overcoat layer 40 and the common electrode 50 may be provided according to the structure of an electro-optical apparatus, to which the color filter is applied. Thereafter, plural color filters are produced by cutting the color filter substrate 1000 at predetermined positions.

(Features of Manufacturing Method)

Figure 6:
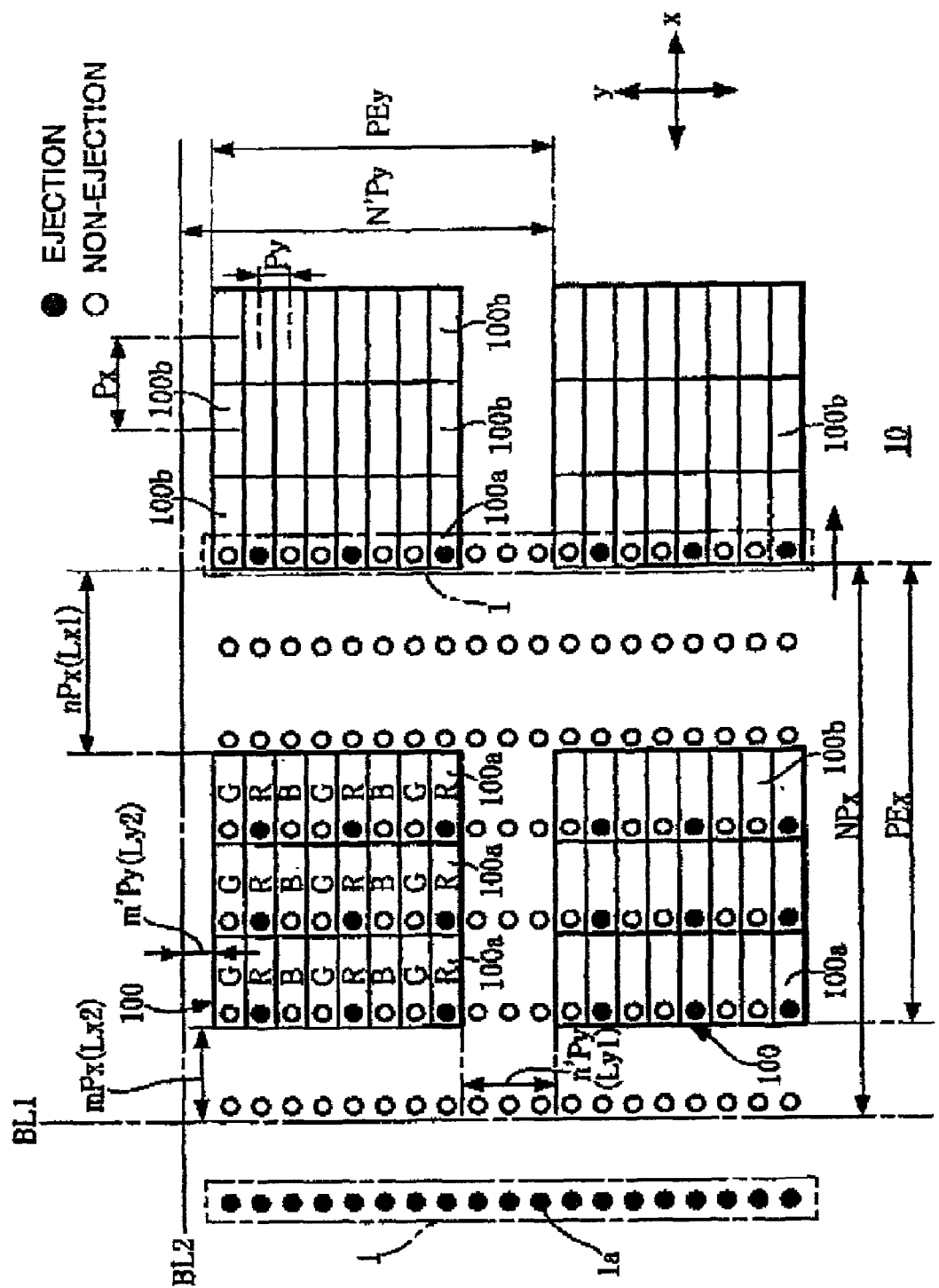
FIG. 6 is a plan view schematically illustrating a method for manufacturing the color filter substrate according to the first embodiment.

FIG. 6 is a plan view illustrating the manufacturing method according to the present invention and showing steps corresponding to FIGS. 5(A) and 5(B). In FIG. 6, to simplify the drawing, color dots 100a and color-dot forming regions 100b are shown. Also, in FIG. 6, an example of forming stripe-type pixels is shown.

In FIG. 6, a first base line BL1 and second base line BL2 are established along the y direction and x direction, respectively.

According to the embodiment, an inkjet head 1 for use in the inkjet printing is moved relative to the substrate 10 in the x direction so as to supply ink to the color-dot forming regions 100b, specifically to the colored-layer forming regions 330 (see FIGS. 5(A) and (B)), completing the color dots 100a.

The inkjet head 1 has a nozzle array having plural nozzles 1a arranged linearly. In the nozzle array of the inkjet head 1, the nozzles are arranged at a predetermined pitch in the direction of the first base line BL1 (the same pitch as the second dot pitch Py, in this example). Also, the nozzle array of the inkjet head 1 is set to have plural rows (two rows, in this example) of the forming regions of the color filter elements 100 in the direction of the first base line BL1. In this example, since the pitch of nozzles 1a is set to be the same as the second dot pitch Py, the nozzle array length of the inkjet head 1 is substantially the same as an effective nozzle array length.

Figure 12:
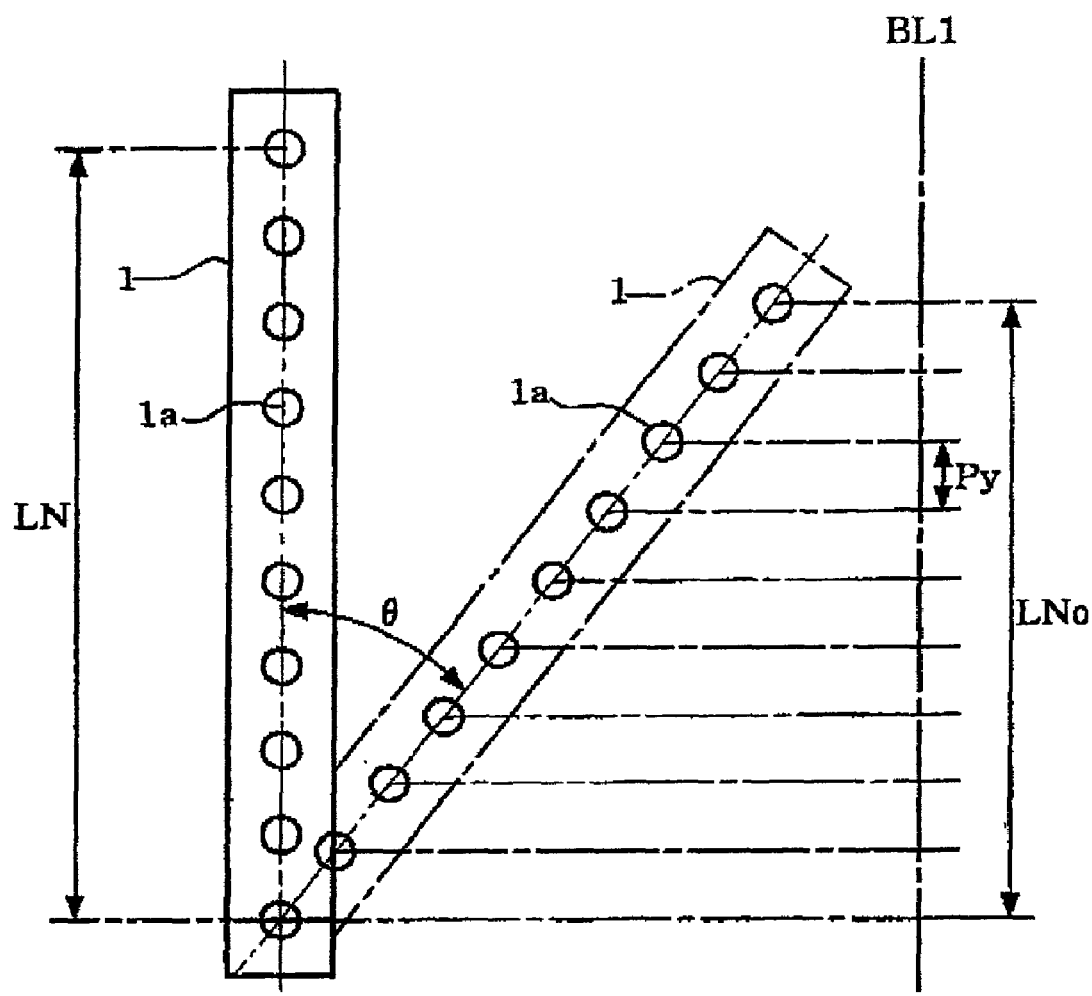
FIG. 12 is schematic illustrating an effective nozzle-array length.

"The effective nozzle array length", as shown in FIG. 12, denotes a length Lno of the nozzle array for the first base line BL1 when the inkjet head 1 is inclined by an angle q relative to the first base line BL1. When the pitch of the nozzles 1a is not in conformity with the second dot pitch Py, by inclining the inkjet head 1 relative to the first base line BL1, a desired nozzle pitch can be established. A symbol "LN" denotes the nozzle array length of the inkjet head 1.

The base lines BL1 and BL2, the color filter element 100, the color dot 100a, and the color-dot-forming region 100b satisfy the following conditions (a) to (c).

(a) Each color-dot forming region 100b for the color filter element 100 is established to lie at a distance (NPx, N is an integer) of at least substantially an integral multiple of the first dot pitch Px of the x direction from the first base line BL1 of the y direction. Furthermore, each color-dot forming region 100b for the color filter element 100 is established to lie at a distance (N'Py, N' is an integer) of substantially an integral multiple of the second dot pitch Py of the y direction from the second base line BL2 of the x direction.

(b) The spacing between the color filter elements 100 is established as follows. A spacing Lx1 in the direction of the second base line BL2 is set to be an integral multiple (nPx, n is an integer except zero) of the first dot pitch Px. A spacing Ly1 in the direction of the first base line BL1 is set to be an integral multiple (n'Py, n' is an integer except zero) of the second dot pitch Py.

That is, a first element pitch PEx in the direction of the second base line BL2 is established to be an integral multiple of the first dot pitch Px, while a second element pitch PEy in the direction of the first base line BL1 is established to be an integral multiple of the second dot pitch Py.

(c) A spacing Lx2 from the first base line BL1 to the first line of the color filter elements 100 is set to be an integral multiple (mPx, m is an integer) of the first dot pitch Px. A spacing Ly1 from the second base line BL2 to the first row of the color filter elements 100 is set to be an integral multiple (m'Py, m' is an integer) of the second dot pitch Py.

When the conditions (b) and (c) are satisfied, the condition (a) is satisfied. Therefore, according to the embodiment, in order to form the color dots 100a by the inkjet system using the inkjet head 1, ink-ejecting positions are established so as to satisfy the condition (a), or the condition (b) plus the condition (c).

On the basis of the positional information of the base lines BL1 and BL2 and the information required to form the colored layer, ink is ejected at a predetermined position so as to form the color dot 100a. The information required to form the color dot 100a is appropriately selected based on the operating method of the inkjet head, or the like, and it includes the information to specify the position of the color-dot-forming region, the information to specify the color of the colored layer, and the information to specify the ejection timing to the color-dot-forming region, for example.

In addition, in the example shown in FIG. 6, as a positional reference of the color dot 100a or the color-dot forming region 100b, sides of each color dot 100a or color-dot forming region 100b toward the base lines BL1 and BL2 are adopted. For such a positional reference, the center of each color dot or color-dot-forming region or other positions may, of course, be adopted.

Next, referring to FIG. 6, the method of forming the color dot 100a will be more specifically described. FIG. 6 shows a state that the inkjet head 1 has been moved until the first line of the color-dot forming region in the second-line color filter element. Black circles denote regions in which ink is ejected with the nozzles 1a of the inkjet head 1, while white circles denote regions in which ink is not ejected with the nozzles 1a of the inkjet head 1.

In this example, first, the inkjet head 1 is moved in the x direction relative to the substrate 10, so that, based on the above-mentioned information required to form the color dot, the ink of a first color (red (R) in this example) is ejected so as to form the red color dots 100a. At this time, in the color-dot-forming regions 100b to form colors other than red and in regions having no color filter element 100 formed therein, ink is not ejected. During one round movement of the inkjet head 1 in the x direction, the first-color color dots in the first and the second row in the y direction are formed.

Then, the inkjet head 1 is moved relative to the substrate 10 in the y direction so as to form the first-color color dots of the third and the fourth row. Afterward, the first-color color dots are similarly formed every two rows.

Next, using the inkjet head 1 with different colors, the color dots 100a of the second-color (blue or green) and the third-color (remained color) are formed in the same way as in the first-color. In such a manner, the color dots 100a of the three primary colors are formed at predetermined positions so as to obtain the color filter substrate 1000 having plural color filter elements 100 arranged in a matrix pattern.

According to the manufacturing method of the embodiment, each color dot 100a is established to lie at distances of an integral multiple of the first dot pitch and the second dot pitch from the first base line BL1 and the second base line BL2, respectively, so that positional data of the color-dot forming region can be prescribed by the first dot pitch and the second dot pitch, facilitating the design.

(Features of Color Filter Substrate)

The color filter substrate 1000 obtained by the manufacturing method described above, as shown in FIGS. 1 and 2, has the following configurations reflecting features of the manufacturing method.

(a) Each color-dot 100a that constitutes the color filter element 100 is located at a distance (NPx, N is an integer) of at an integral multiple of the first dot pitch Px of the x direction from the first base line BL1 of the y direction. Furthermore, each color dot 100a is located at a distance (N'Py, N' is an integer) of an integral multiple of the second dot pitch Py of the y direction from the second base line BL2 of the x direction.

(b) The spacing between the color filter elements 100 is established as follows. A spacing Lx1 in the direction of the second base line BL2 is an integral multiple (nPx, n is an integer except zero) of the first dot pitch Px. A spacing Ly1 in the direction of the first base line BL1 is an integral multiple (n'Py, n' is an integer except zero) of the second dot pitch Py.

That is, a first element pitch PEx in the direction of the second base line BL2 is an integral multiple of the first dot pitch Px while a second element pitch PEy in the direction of the first base line BL1 is an integral multiple of the second dot pitch Py.

(c) A spacing Lx2 from the first base line BL1 to the first line of the color filter elements 100 is an integral multiple (mPx, m is an integer) of the first dot pitch Px. A spacing Ly2 from the second base line BL2 to the first row of the color filter elements 100 is an integral multiple (m'Py, m' is an integer) of the second dot pitch Py.

(Modifications of Color Filter Substrate)

[First Modification]

Figure 7:
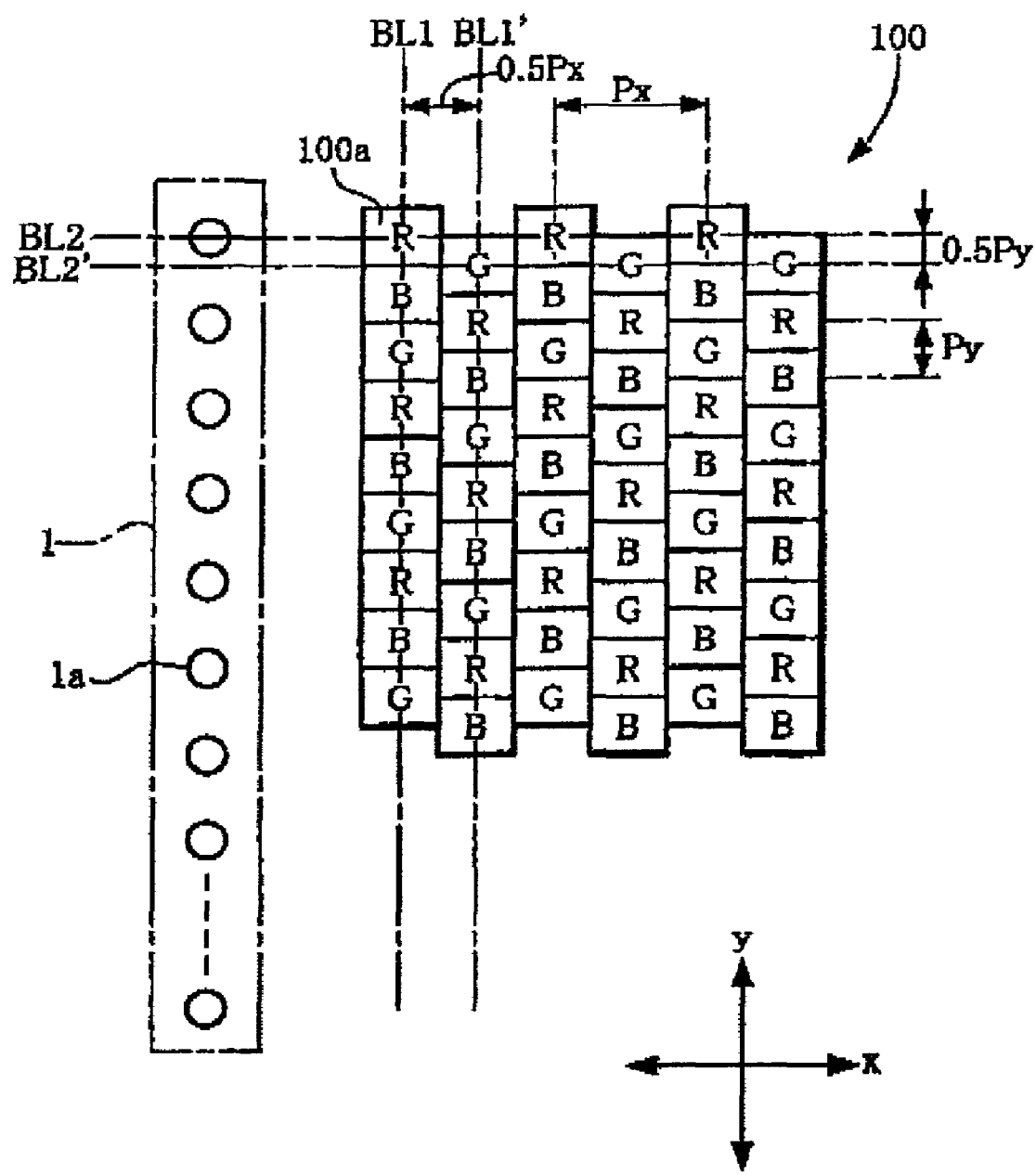
FIG. 7 is a plan view illustrating the manufacturing method of the color filter substrate according to the first embodiment having color filter elements with delta-type arrangement.

FIG. 7 is a schematic showing a manufacturing method of a color filter substrate including color filter elements 100 arranged in a delta array. In this example, two first base lines BL1 and BL1' are established in the y direction, while two second base lines BL2 and BL2' are established in the x direction.

In this example, in the x direction, the odd number-th line of the color dot arrays is located at a distance of an integral multiple of the first dot pitch Px from one first base lines BL1, while the even number-th line of the color dot arrays is located at distance of an integral multiple of the first dot pitch Px from the other first base lines BL1'. Similarly, in the y direction, the odd number-th row of the color dot arrays is located at a distance of an integral multiple of the second dot pitch Py from one second base lines BL2, while the even number-th row of the color dot arrays is located at distance of an integral multiple of the second dot pitch Py from the other second base lines BL2'.

The spacing in the x direction between one first base lines BL1 and the other first base lines BL1' is 0.5 Px, while the spacing in the y direction between one second base lines BL2 and the other second base lines BL2' is 0.5 Py.

This example also basically satisfies the conditions (a) to (c) described in the manufacturing method of the stripe-type color filter substrate. In addition, in the example shown in FIG. 7, the positional reference of the color dot 100a is prescribed by the color-dot center.

Also, in this example, just like in the embodiment described above, positional data of the color-dot-forming region can be prescribed by the first dot pitch and the second dot pitch, facilitating the design.

[Second Modification]

Figure 16:
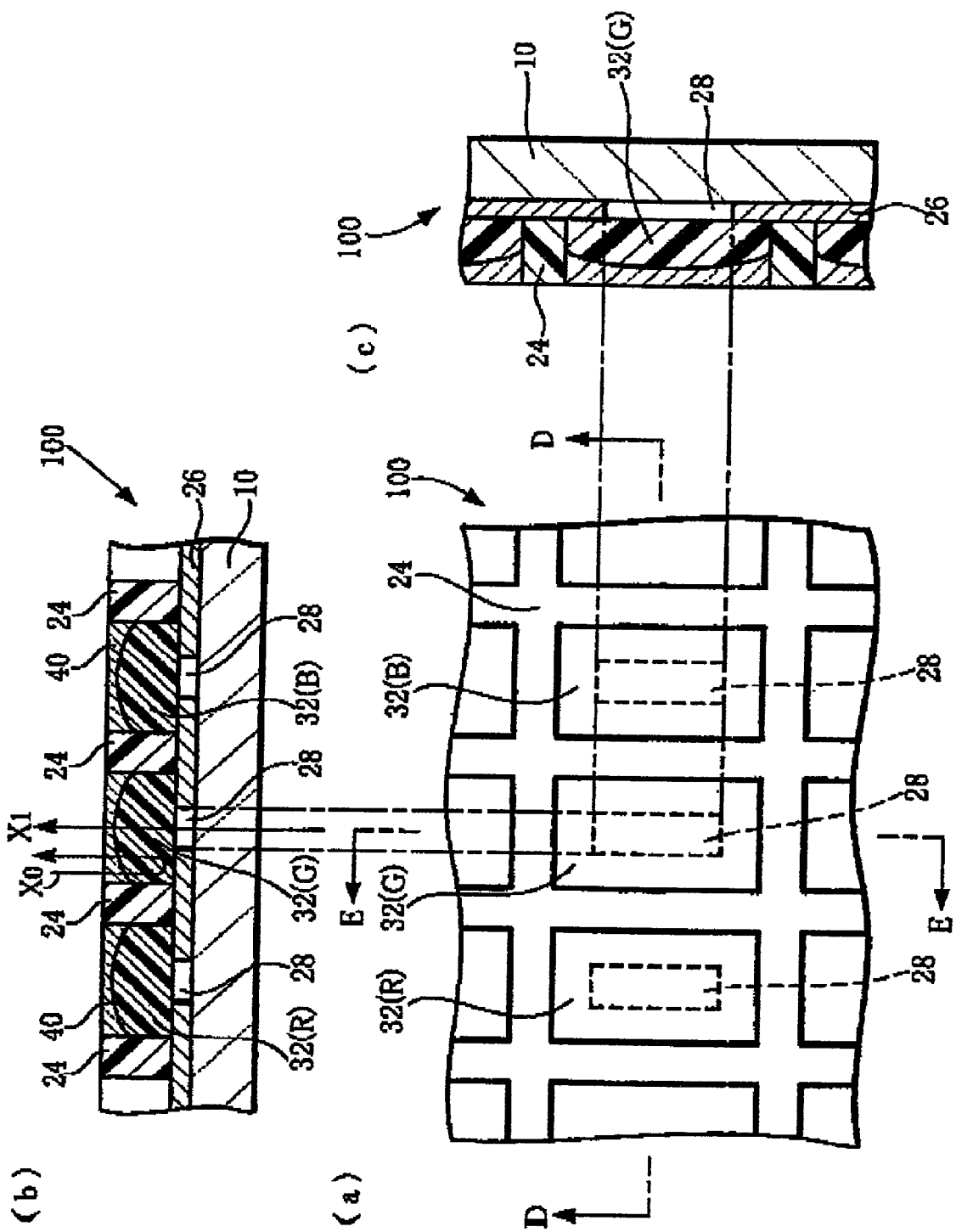
FIGS. 16(a) to (c) show modifications of the color filter substrate according to the first embodiment, where.

FIGS. 16(a) to (c) show a modification of a color filter substrate, where: FIG. 16(a) is a plan view of color filter elements constituting the color filter substrate; FIG. 16(b) is a sectional view taken along plane D—D of FIG. 16(a); FIG. 16(c) is a sectional view taken along plane E—E of FIG. 16(a), where like reference characters designate substantially like functional portions common to those in FIGS. 2 and 3.

The color filter element 100 of the color filter substrate in this example is different from the light-transmission type color filter substrate described above with regard to the semi-transmissive reflection type.

The color filter element 100 according to the embodiment, as shown in FIGS. 16(a)–(c), includes the transparent substrate 10, a reflection layer 26 to reflect light (visible light), and a transmission layer 28 to allow light to be transmitted. The bank layer 24 is formed on the reflection layer 26. Within a colored-layer-forming region defined by the bank layer 24, colored layers (colored dots) 32 (32(R), 32(G), and 32(B)) are arranged. The overcoat layer 40 is further formed on the colored layers 32 to perform flattening.

The transmission layer 28 is formed so as to lie in the center of the colored-layer forming region defined by the bank layer 24. The colored layers (colored dots) 32 are formed by the inkjet method. The colored layer formed by the inkjet method generally has a tendency to rise in the middle part of the colored-layer forming region. Therefore, by forming the transmission layer 28 in the middle part of the colored-layer-forming region, optical film thicknesses during reflection display and during transmission display can be substantially equalized or the both can be drawn near, resulting in the reflection color display and transmission color display approximating each other.

That is, during reflection display, display light, as shown by the arrow X0 in FIG. 16(b), passes a thin-film portion of the colored layer 32 by reciprocating, whereas, during transmission display, display light, as shown by the arrow X1 in FIG. 16(b), passes through a thick-film portion of the colored layer 32. Therefore, by forming the colored layer 32 to be convex in section as shown in FIGS. 16(b) and (c), the optical film thicknesses during reflection display and during transmission display can be approximated.

Second Embodiment

Figure 8:
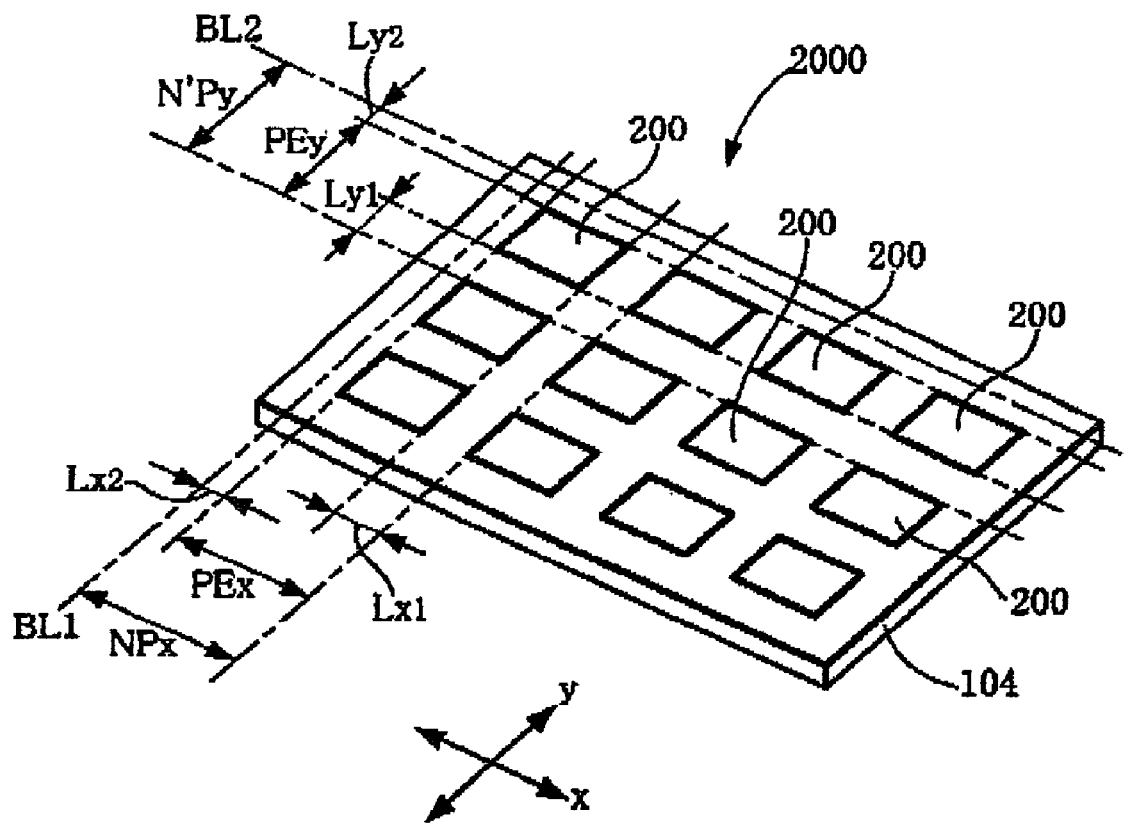
FIG. 8 is a schematic perspective view of a color luminescent substrate according to a second embodiment of the present invention.
Figure 9:
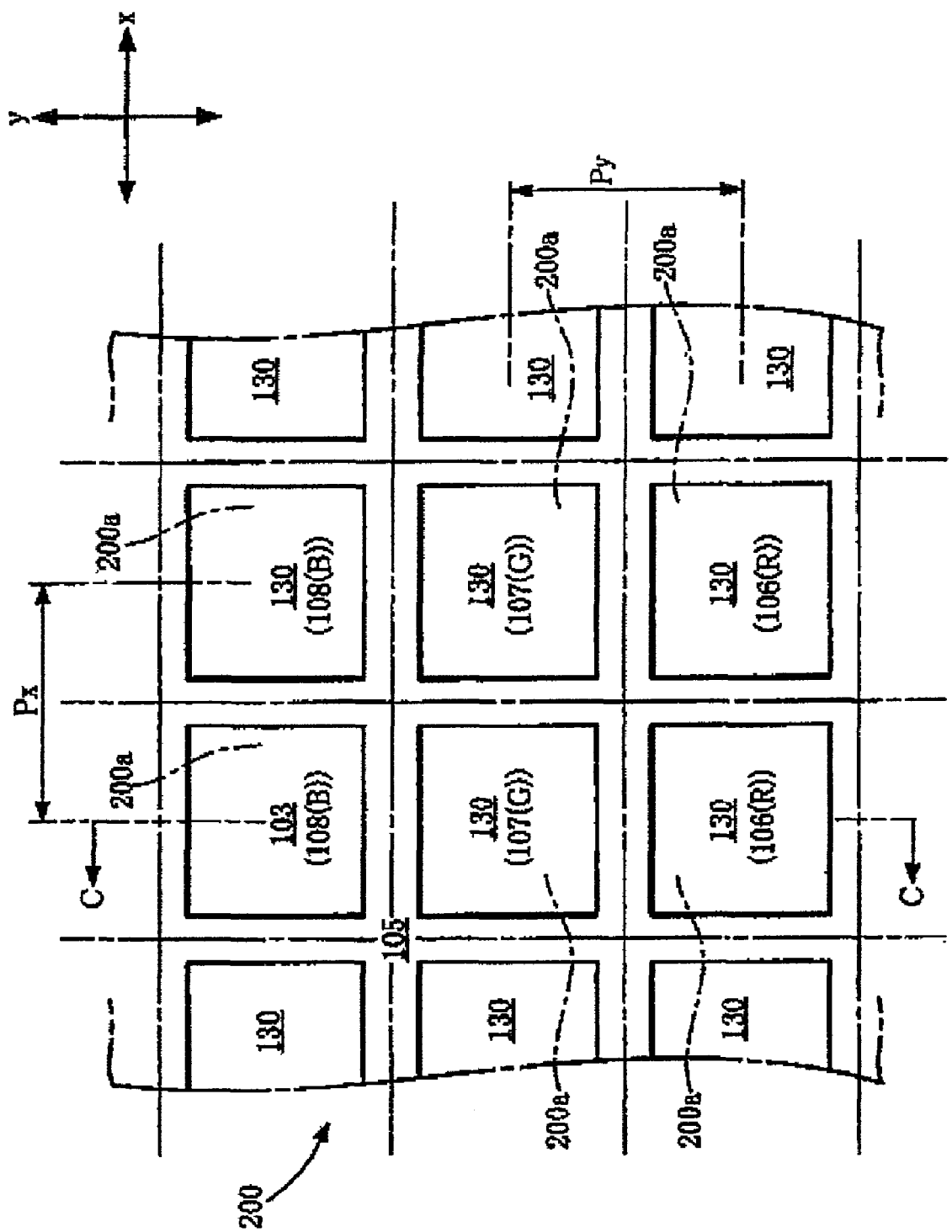
FIG. 9 is a plan view of a color luminescent element constituting the color luminescent substrate shown in FIG. 8.

FIG. 8 is a schematic perspective view of a color luminescent substrate (display motherboard) as an example of the color display substrate applied in the present invention; FIG. 9 is a plan view of a significant part of a color luminescent element (unit constituting the display) forming the color luminescence substrate; and FIG. 10(D) is a sectional view taken along plane C—C of FIG. 9.

(Overview of Color Luminescence Substrate)

An overview of a color luminescent substrate 2000 according to a second embodiment will be described. The color luminescent substrate 2000 includes a transparent substrate 104 and plural color luminescent elements 200 formed on the substrate 104 in a matrix pattern. A plurality of color illuminators can be obtained by cutting the color luminescence substrate 2000 at predetermined positions afterward.

The color luminescent element 200 according to the embodiment, as shown in FIGS. 9 and 10(D), includes the transparent substrate 104, a bank layer 105, which does not allow light (visible light) to be substantially transmitted, and a light-luminescent region 130. The luminescent region 130 is a region defined by the bank layer 105, and it includes a first electrode (positive electrode in this example) deposited on the substrate 104, a positive-hole injection layer, a luminescent layer, and a second electrode (negative electrode in this example). The substrate 104 functions as a surface, from which light is emitted, while serving as a supporter. Therefore, the material of the substrate 104 is selected in consideration of light-transmitting characteristics and thermal stability. A glass substrate and transparent plastic are examples of the material of the transparent substrate.

According to the embodiment, the positive-hole injection layer represents a layer that can inject a positive hole into the luminescent layer from the positive electrode and also has a transporting function of the positive hole. A positive-hole transport layer may be separately provided along with the positive-hole injection layer.

According to the embodiment, in the same way as in the first embodiment, the length of one dot pitch of the luminescent region 130 and the bank layer 105 is prescribed to as one color dot (dot element) 200a, as shown in FIG. 9. In the description below, the dot pitch of the color dots 200a forming the color luminescent element 200 in the X direction is referred to as a first dot pitch Px, while the dot pitch in the Y direction is referred to as a second dot pitch Py. In the color luminescent substrate 2000, as shown in FIG. 8, the element pitch of the color luminescent element 200 in the X direction is referred to as a first element pitch PEx, while the element pitch in the y direction is referred to as a second element pitch PEy. In addition, the dot pitch and element pitch are the same as those in the first embodiment.

The bank layer 105 has a predetermined pattern. The bank layer 105 defines regions to be formed by luminescent layers, and functions as a barrier to prevent adjacent luminescent layers from being mixed with each other (color mixture).

The bank layer 105 is formed of a resin layer, on which photolithography can be performed in the same way as in the first embodiment.

The light-luminescent region 130 includes plural luminescent layers 106 (R), 107 (G), and 108 (B), each for red, green, and blue, which constitute the three primary colors. These luminescent layers are arranged according to a predetermined arrangement pattern, such as striped arrangement, delta arrangement, mosaic arrangement, and square arrangement, and one pixel is constituted of continuous luminescent layers with three respective colors.

Features of the color luminescent substrate 2000 and the color luminescent element 200 according to the embodiment will be described below.

(Manufacturing Method of Color Luminescent Substrate)

Referring now to FIGS. 10(A) to (D), an overview of a manufacturing method of the color luminescent substrate will be described. FIGS. 10(A) to (D) show manufacturing steps of the color luminescent substrate using organic EL (referred to as an organic EL substrate below).

(A) First Electrode and Bank Layer Forming

First, as shown in FIG. 10(A), first electrodes (referred to as a pixel electrode below) 101, 102, and 103 with predetermined patterns are formed on the transparent substrate 104. Photolithography, vacuum deposition, sputtering, and pyrosol are examples of a forming method of the pixel electrode; however, photolithography is preferable. A transparent electrode is preferable as the pixel electrode. Tin oxide, ITO, and compound oxide of indium oxide and zinc oxide are examples of the material of the transparent electrode.

Then, the bank layer 105 is formed of photosensitive polyimide so as to separate between the adjacent transparent electrodes. The bank layer 105 functions as a black matrix layer while functioning as a barrier as well, so as to enhance contrast and to prevent the color mixture of luminescent materials, and further to prevent light from leaking from between adjacent color dots.

The material of the bank layer 105 is not specifically limited as long as it has durability against the solvent of an EL material. An organic material is preferable, such as an acrylic resin, epoxy resin, and photosensitive polyimide, because they can be Teflonized (registered trademark) by fluorocarbon gas plasma polymerization. The material may be also a deposited bulkhead having an underlayer of an inorganic material, such as liquid glass. The bank layer 105 may also be a black resist made of the above-mentioned material having carbon black mixed therewith. Photolithography is an example of a forming method of the bank layer 105.

Before coating the substrate with ink for the positive-hole injection layer and the positive-hole transport layer, which is further formed on demand, continuous plasma polymerization may be performed on the substrate 104 using oxygen gas and fluorocarbon gas plasma. Thereby, the surface of the bank layer 105 is made to be water-repellent while surfaces of the transparent pixel electrodes 101, 102, and 103 are made to be water-receptive, so that wettability of the substrate relative to inkjet-liquid droplets can be controlled. Any of apparatuses generating plasma under vacuum pressure and under atmospheric pressure may be similarly used as a plasma generating apparatus.

(B) Luminescent Layer Forming

Next, as shown in FIG. 10(A), ink for the positive-hole injection layer is ejected from the head 1 of an inkjet printing apparatus 109 so as to supply the ink on the pixel electrodes 101, 102, and 103. Then, solvent is removed and heat-treatment is further performed so as to form a positive-hole injection layer 120 incompatible with ink for the luminescent layer. According to the embodiment, the same material for positive-hole injection is used for each color dot; however, in some cases, the positive-hole injection layer (or the positive-hole transport layer) may be formed by using positive-hole injection materials (or positive-hole transport materials) respectively appropriate to each luminescent layer.

Furthermore, as shown in FIG. 10(B), the positive-hole injection layer 120 is sequentially coated thereon with ink for the red luminescent layer and ink for the green luminescent layer by the inkjet system. Then, solvent is removed and heat-treatment is successively performed in an atmosphere of nitrogen so as to form the red luminescent layer 106 and the green luminescent layer 107 by curing or conjugating the ink composition. The luminescent layer conjugated by the heat-treatment is insoluble in solvent.

By such an inkjet system, very small patterning can be simply performed in a short period of time. Also, by changing the ink solid-content concentration and the amount of ink injection, the film thickness can be changed.

Before forming the luminescent layer, the continuous plasma polymerization may be performed on the positive-hole injection layer 120 using oxygen gas and fluorocarbon gas plasma. Thereby, a fluorine compound layer is formed on the positive-hole injection layer (or positive-hole transport layer) 120 so as to enhance ionization potential, enabling the organic EL substrate with high efficiency of positive-hole injection to be provided.

(C) Luminescent Layer Forming

Then, as shown in FIG. 10(C), the blue luminescent layer 108 is formed on the positive-hole injection layer 120 on the pixel electrode 103. By the steps described above, the luminescent layers 106, 107, and 108 of the three primary colors, one each for red, green, and blue, are formed.

In the forming step of the blue luminescent layer 108, layers 108a and 108a made of the same material as that of the blue luminescent layer 108, along with the blue luminescent layer 108, are formed on the red luminescent layer 106 and the green luminescent layer 107. These layers 108a reduce the height difference between the luminescent layers 106 and 107 and the bank layer 105 so as to flatten them. By the flattening of the bank layer 105 relative to the neighborhood, the second electrode (negative electrode) can be formed with a high degree of accuracy in a flat state. As a result, short-circuit between the upper and lower electrodes can be securely prevented. By adjusting the film thickness of the blue luminescent layer 108, the layers 108a formed on the red luminescent layer 106 and green luminescent layer 107 function as an electron-injection-and-transform layer and do not emit blue light.

The method of forming the blue luminescent layer 108 is not specifically limited. A spin coating method or inkjet method, which are general as a wet system, may be employed.

As in the embodiment, two colors in the organic luminescent layer are formed by the inkjet method while the other one color being formed by a conventional coating method, so that even a luminescent material, which is not so applicable to the inkjet method, can be used for a full-color organic EL substrate by combining with other organic luminescent materials applicable to the inkjet method, resulting in increasing of the degree of element design. A printing method, transfer method, dipping method, spin coating, cast coating, capillary method, roll coating, and bar coating are examples of a coating method other than the inkjet system that can be used.

(D) Negative Electrode Forming

Then, as shown in FIG. 8(D), a negative electrode (opposing electrode) 113 is formed. A metallic thin-film electrode is preferable as the negative electrode 113. Magnesium, silver, aluminum, and lithium are examples of a metal for the negative electrode. Other than those, a material with a small work function may also be used, such as an alkaline-earth metal, such as an alkali metal and potassium, and an alloy of these materials. A fluorinated metal may also be applicable. Such a negative electrode 113 may be formed by vapor deposition, sputtering, or the like.

A protection film may be further formed on the negative electrode 113. By forming the protection film, the negative electrode 113 and the luminescent layers 106, 107, and 108 can be prevented from degradation, damages, and breaking away.

An epoxy resin, acrylic resin, and liquid glass are examples of a material of such a protection film. Spin coating, cast coating, dipping method, bar coating, roll coating, and capillary method are examples of a forming method of the protection film.

The opposing electrode 113 may be provided depending on the configuration of the electro-optical apparatus, to which a color illuminator is applied. Then, by cutting the color luminescent substrate 2000 at predetermined positions, plural color illuminators are obtained.

In the manufacturing method described above, known substances may be used as a material of each layer. Also, materials disclosed in Japanese Unexamined Patent Application Publication No. 11-134320 and Japanese Unexamined Patent Application Publication No. 11-250486, which are applied by the Applicant, may be used as materials of the positive-hole injection layer and luminescent layer.

According to the manufacturing method described above, two-color luminescent layers in the luminescent layers of the three primary colors are formed by the inkjet system; however, all three-color luminescent layers may be of course formed by the inkjet system. Furthermore, in the manufacturing method described above, the positive-hole injection layer (positive-hole transport layer) and the luminescent layer to form the color dots are formed by the inkjet system; however, the luminescent layer may only be formed.

(Features of Manufacturing Method)

Figure 11:
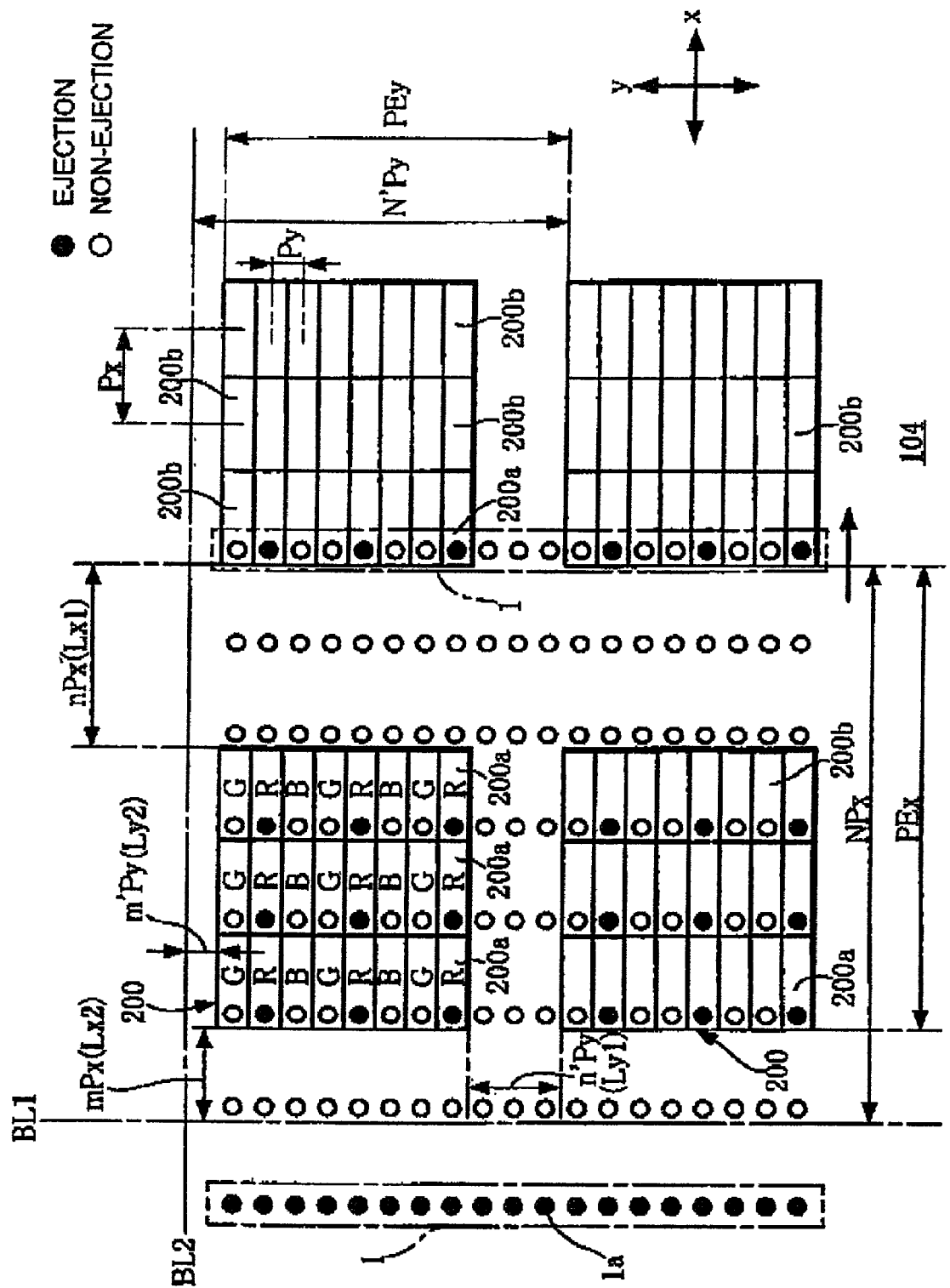
FIG. 11 is a plan view schematically illustrating a method for manufacturing the color luminescent substrate according to the second embodiment.

FIG. 11 is a plan view illustrating the manufacturing method according to the present invention and showing steps corresponding to FIGS. 10 (A) and (B). In FIG. 11, to simplify the drawing, the color dots 200a and color-dot-forming regions 200b are shown. In FIG. 11, forming stripe-type pixels is exemplified.

According to the embodiment, the color dots 200a are basically formed by the same method as that in the color dots 100a according to the first embodiment. That is, according to the first embodiment, the colored layer forming the color filter element is formed by the inkjet system, whereas according to the embodiment, it is different in the point that the positive-hole injection layer and the luminescent layer to form the color luminescent element are formed by the inkjet system.

In the example of FIG. 11, the first base line BL1 and second base line BL2 are established along the y direction and x direction, respectively.

According to the embodiment, the inkjet head 1 for use in the inkjet printing is moved relative to the substrate 104 in the x direction so as to supply ink (ink for the positive-hole injection layer and the luminescent layer) to the color-dot forming regions 200b, specifically to the light-luminescent regions 130 (see FIGS. 10(A) and (B)) to form a positive-hole injection layer and luminescent layer, completing the color dots 200a.

The inkjet head 1, in the same way as the first embodiment, has a nozzle array having plural nozzles 1a arranged linearly. In the nozzle array, the nozzles 1a are arranged at a predetermined pitch in the direction of the first base line BL1 (the same pitch as the second dot pitch Py, in this example). Also, the nozzle array of the inkjet head 1 is set to have plural rows (two rows, in this example) of the forming regions of the color luminescent elements 200 in the direction of the first base line BL1.

The base lines BL1 and BL2, the color luminescent element 200, the color dot 200a, and the color-dot-forming region 200b, in the same way as in the first embodiment, satisfy the following conditions (a) to (c).

(a) Each color-dot-forming region 200b for the color luminescent element 200 is established to lie at a distance (N'Px, N' is an integer) of at least substantially an integral multiple of the first dot pitch Px of the x direction from the first base line BL1 of the y direction. Furthermore, each color-dot-forming region 200b is established to lie at a distance (NPy, N is an integer) of substantially an integral multiple of the second dot pitch Py of the y direction from the second base line BL2 of the x direction.

(b) The spacing between the color luminescent elements 200 is established as follows. The spacing Lx1 in the direction of the second base line BL2 is set to be an integral multiple (nPx, n is an integer except zero) of the first dot pitch Px. The spacing Ly1 in the direction of the first base line BL1 is set to be an integral multiple (n'Py, n' is an integer except zero) of the second dot pitch Py.

That is, a first element pitch PEx in the direction of the second base line BL2 is established to be an integral multiple of the first dot pitch Px, while a second element pitch PEy in the direction of the first base line BL1 is established to be an integral multiple of the second dot pitch Py.

(c) The spacing Lx2 from the first base line BL1 to the first line of the color luminescent elements 200 is set to be an integral multiple (mPx, m is an integer) of the first dot pitch Px. The spacing Ly1 from the second base line BL2 to the first row of the color luminescent elements 200 is set to be an integral multiple (m'Py, m' is an integer) of the second dot pitch Py.

When the conditions (b) and (c) are satisfied, the condition (a) is satisfied. Therefore, according to the embodiment, in order to form the color dots 200a by the inkjet system using the inkjet head 1, ink-ejecting positions are established so as to satisfy the condition (a), or the condition (b) plus the condition (c).

On the basis of the positional information of the base lines BL1 and BL2 and the information required to form the positive-hole injection layer and luminescent layer, ink is ejected at a predetermined position so as to form the color dot 200a. The information required to form the color dot 200a is appropriately selected based on the operating method of the inkjet head, or the like, and it includes the information to specify the position of the color-dot-forming region, the information to specify the color of the luminescent layer, and the information to specify the ejection timing to the color-dot-forming region, for example.

Next, referring to FIG. 11, the method of forming the color dot 200a will be more specifically described. FIG. 11 shows a state that the inkjet head 1 has been moved until the first line of the color-dot-forming region in the second-line color filter element. Black circles denote regions in which ink is ejected with the nozzles 1a of the inkjet head 1, while white circles denote regions in which ink is not ejected with the nozzles 1a of the inkjet head 1.

In this example, the inkjet head 1 is moved in the x direction relative to the substrate 10, so that based on the above-mentioned information required to form the color dot, the positive-hole injection layer, the positive-hole transport layer, which is formed on demand, and the luminescent layer are sequentially formed.

First, the positive-hole injection layer (see FIG. 10(a)) and the positive-hole transport layer, which is formed on demand, are formed. Then, the first-color color dot 200a (red (R) in this example) is formed. During one round movement of the inkjet head 1 in the x direction, the positive-hole injection layers and the positive-hole transport layers, which are formed on demand, and the first-color luminescent layers in the first and the second row in the y direction are formed.

Then, the inkjet head 1 is moved relative to the substrate 10 in the y direction so as to form the first-color color dots of the third and the fourth row. Afterward, the first-color color dots are similarly formed every two rows.

Next, using the inkjet head 1 with different colors, the color dots 200a of the second-color (blue or green) and the third-color (remained color) are formed in the same way as in the first-color. In such a manner, the color dots 200a of at least the positive-hole injection layer and the three primary colors are formed at predetermined positions so as to obtain the color luminescent substrate 2000 having plural color luminescent elements 200 arranged in a matrix pattern.

One of the three colors may be formed by a coating method other than the inkjet system as the method shown in FIG. 10.

According to the manufacturing method of the embodiment, as in the same way as in the first embodiment, the ejecting timing can be set by the dot pitch, facilitating the design.

(Features of Color Luminescent Substrate)

The color luminescent substrate 2000 obtained by the manufacturing method described above has the following configurations reflecting features of the manufacturing method.

(a) Each color-dot 200a for constituting the color luminescent element 200, as shown in FIGS. 8 and 11, is located at a distance (NPx, N is an integer) of an integral multiple of the first dot pitch Px of the x direction from the first base line BL1 of the y direction. Furthermore, each color dot 200a is located at a distance (N'Py, N' is an integer) of an integral multiple of the second dot pitch Py of the y direction from the second base line BL2 of the x direction.

(b) The spacing between the color luminescent elements 200 is as follows. The spacing Lx1 in the direction of the second base line BL2 is an integral multiple (nPx, n is an integer except zero) of the first dot pitch Px. The spacing Ly1 in the direction of the first base line BL1 is an integral multiple (n'Py, n' is an integer except zero) of the second dot pitch Py.

That is, the first element pitch PEx in the direction of the second base line BL2 is an integral multiple of the first dot pitch Px, while the second element pitch PEy in the direction of the first base line BL1 is an integral multiple of the second dot pitch Py.

(c) The spacing Lx2 from the first base line BL1 to the first line of the color luminescent elements 200 is an integral multiple (mPx, m is an integer) of the first dot pitch Px. The spacing Ly2 from the second base line BL2 to the first row of the color luminescent elements 200 is an integral multiple (m'Py, m' is an integer) of the second dot pitch Py.

Also, in the color luminescent substrate, the pixels in the delta arrangement are the same as described in the first embodiment (see FIG. 7).

Third Embodiment (Electro-Optical Apparatus)

Figure 13:
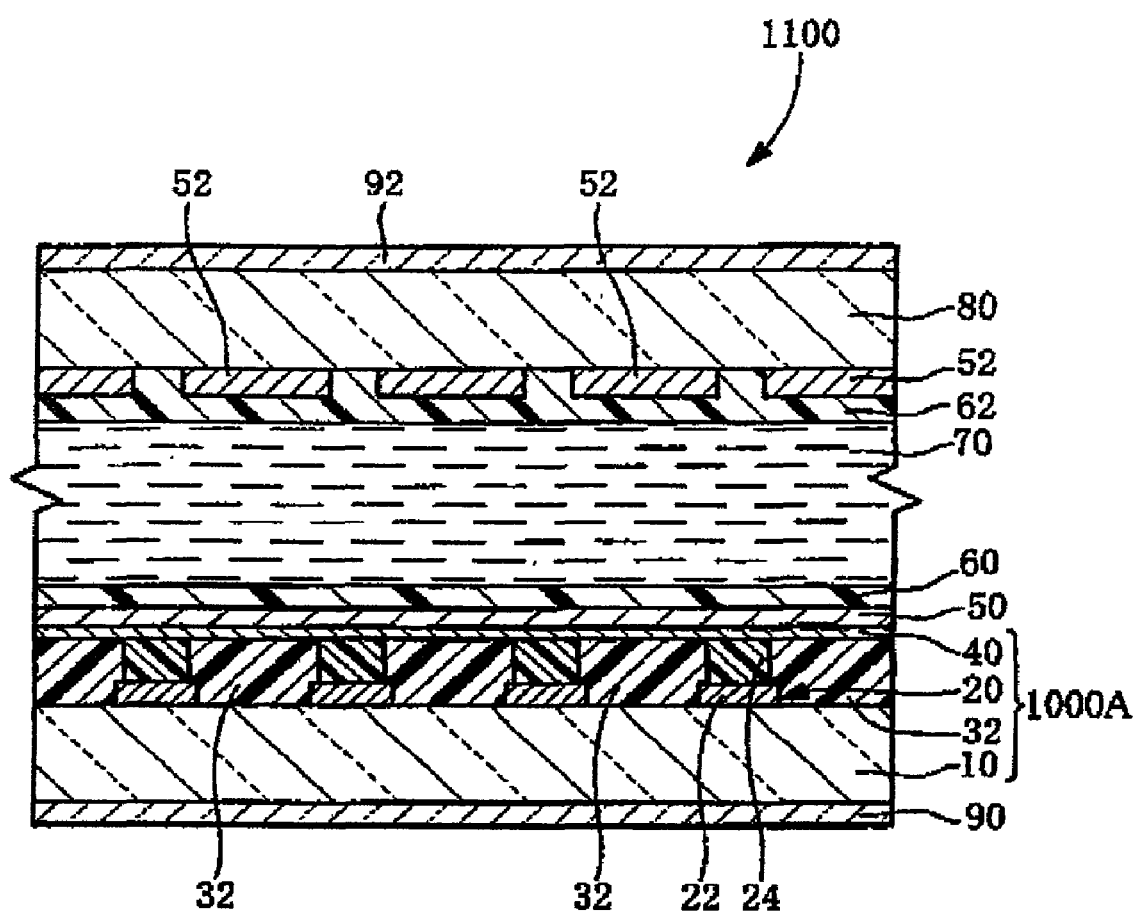
FIG. 13 is a sectional view schematically showing a liquid crystal display as an example of an electro-optical apparatus according to a third embodiment.

FIG. 13 is a sectional view of a significant part of a color liquid-crystal display 1100, as an example of the electro-optical apparatus, in which a color filter 1000A is assembled, which is obtained from the color filter substrate 1000 according to the first embodiment.

The color liquid-crystal display 1100 is configured by combining the color filter 1000A with an opposing substrate 80, and enclosing a liquid-crystal composition 70 between them. On the internal surface of the one substrate 80 of the liquid-crystal display 1100, TFT (thin-film transistor) elements (not shown) and pixel electrodes 52 are formed in a matrix pattern. As the other substrate, the color filter 1000A is placed so as to arrange the red, green, and blue colored layers at positions opposing the pixel electrodes 52. On the respective opposing surfaces of the substrate 80 and the color filter 1000A, oriented films 60 and 62 are formed. The rubbing treatment is performed on the oriented films 60 and 62 so as to orientate liquid crystal molecules in a predetermined direction. Polarizing plates 90 and 92 are respectively bonded on external surfaces of the substrates 10 and 80. As a backlight, the combination of a fluorescent lamp (not shown) and a scatter plate is generally used, and the display is performed by functioning the liquid-crystal composition as an optical shutter for changing transmissivity of the backlight light.

Figure 17:
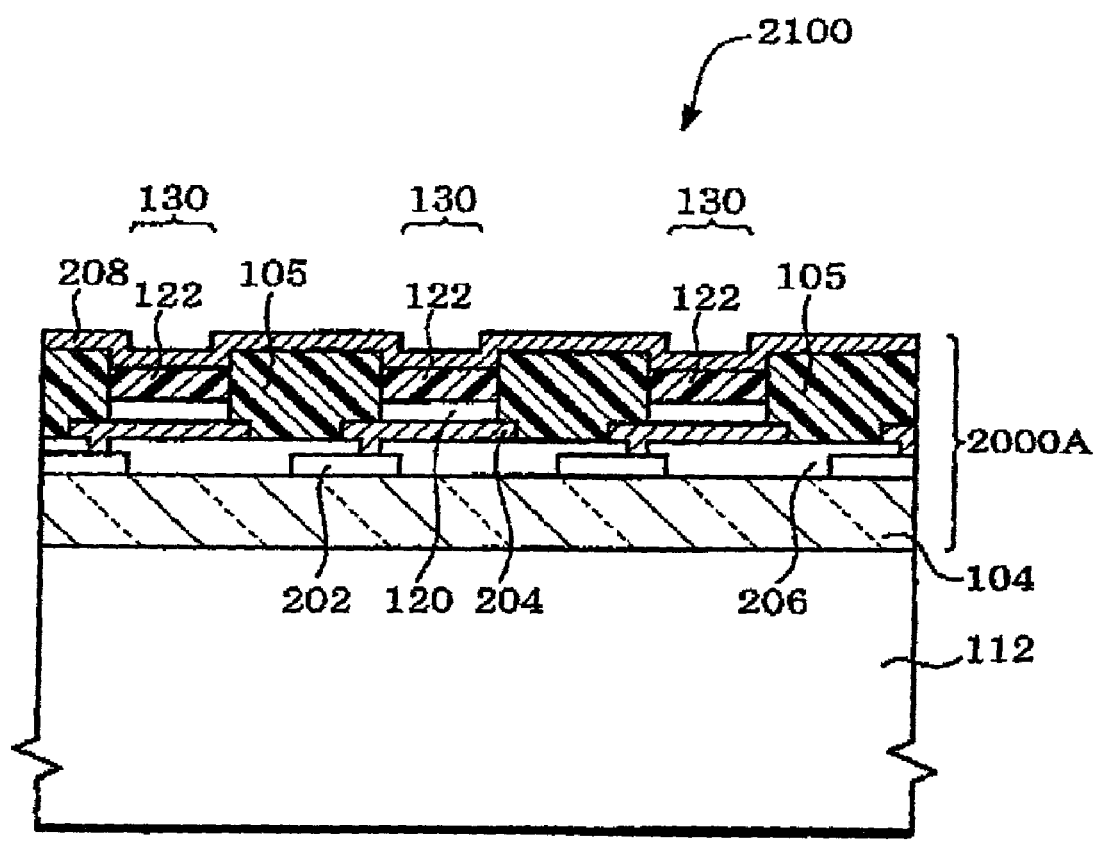
FIG. 17 is a sectional view schematically showing an EL display as an example of the electro-optical apparatus according to the third embodiment.

FIG. 17 is a sectional view of an essential part of a color EL display 2100 as an example of the electro-optical apparatus, in which a color illuminator 2000A is assembled, which is obtained from the color luminescent substrate 2000 according to the second embodiment.

The color EL display 2100 is configured by arranging the color illuminators 2000A on a frame 112. On the substrate 104 of the color illuminators 2000A, switching elements 202, such as the TFT (thin-film transistor) elements, are formed in a matrix pattern. The adjacent switching elements 202 are separated by an insulating layer 206.

The light-luminescent region 130 includes a luminescent layer 122, the positive-hole injection layer 120, and a pair of electrodes of first and second electrodes 204 and 208.

The luminescent layers 122 are arranged on the substrate 104 in a predetermined matrix pattern while being defined by the bank layers 105. The luminescent layer 122 is formed between the first electrode (positive electrode) 204 and the second electrode (negative electrode) 208. The luminescent layer 122 includes plural luminescent layers having each of the three primary colors of red, green, and blue. The luminescent layer 122 is made of an organic material capable of emitting by electroluminescence, for example. Also, between the positive electrode 204 and the luminescent layer 122, the positive-hole injection layer 120 is formed.

Fourth Embodiment (Electronic Device)

Examples of an electronic device using a liquid crystal display will be described below as the electro-optical apparatus according to the present invention.

(1) Digital Still Camera

Figure 14:
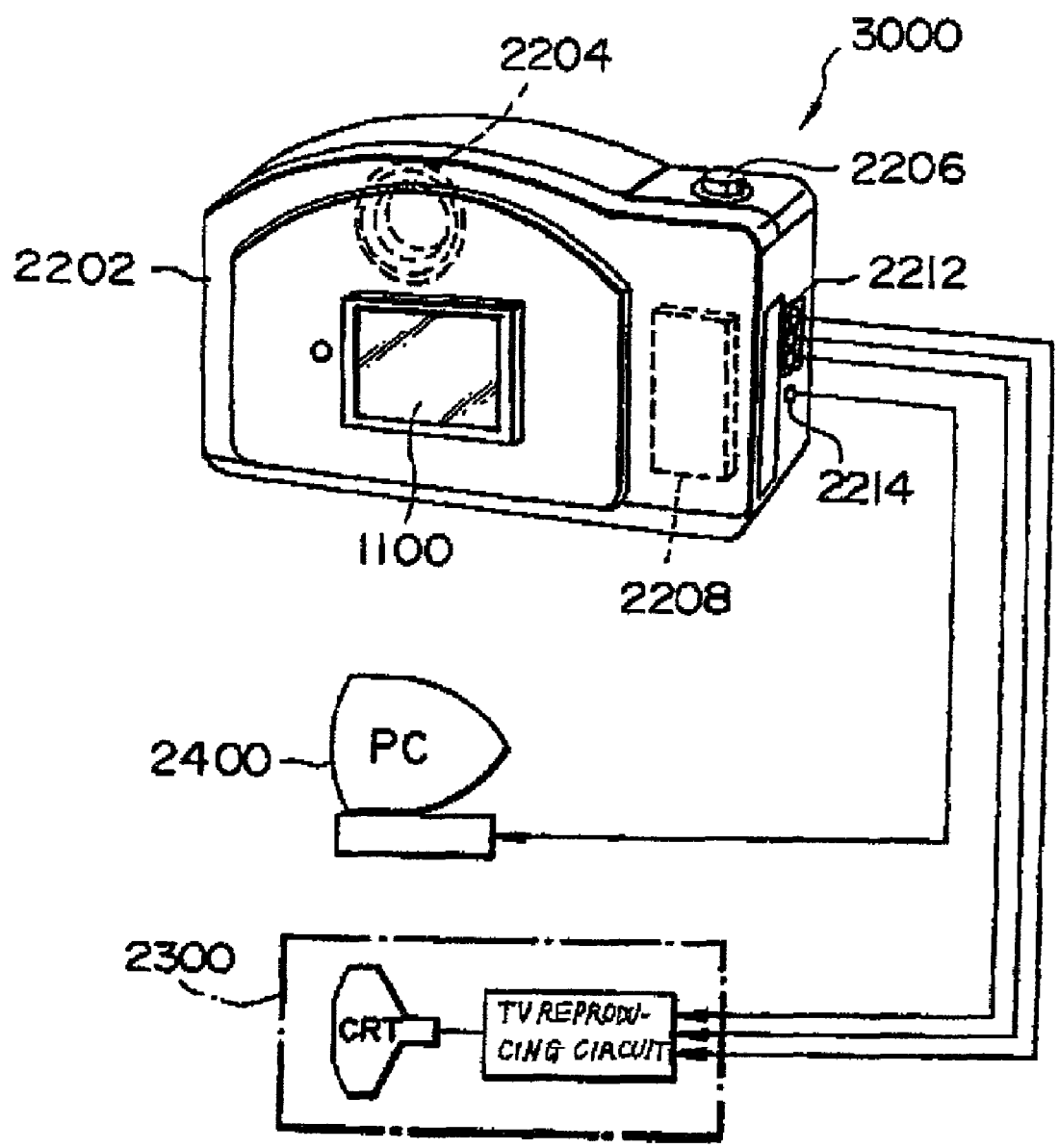
FIG. 14 is a perspective view of a digital still camera as an example of an electronic device according to the present invention.

A digital still camera using the color liquid-crystal display 1100 as a finder will be described. FIG. 14 is a perspective view of the configuration of the digital still camera, further simply showing the connection to external instruments.

In a general camera, the film is exposed to a light figure of an object, whereas in a digital still camera 3000, a light figure of an object is photo-electrically converted by an image pick-up element such as a CCD (charge coupled device) so as to form an image pick-up signal. A case 2202 of the digital still camera 3000 is provided with a liquid crystal panel of the above-mentioned color liquid-crystal display 1100 formed on the back surface (the front side in FIG. 14), and display is performed by the liquid crystal panel based on the pick-up signal by the CCD. Therefore, the liquid-crystal display 1100 functions as a finder to display an object. A light-receiving unit 2204, including an optical lens and a CCD, is arranged on the front surface of the case 2202 (back side in FIG. 14).

When a user pushes a shutter button 2206 down after confirming an object image displayed on the liquid-crystal display 1100, an image pick-up signal of the CCD at that time is transferred and stored in a memory of a circuit board 2208. A side face of the case 2202 of the digital still camera 3000 is provided with video-signal-output terminals 2212 and an input-output terminal 2214 for data communication. As shown in FIG. 14, to the former video-signal-output terminals 2212, a television monitor 2300 is connected, while to the later input-output terminal 2214, a personal computer 2400 is connected, when being demanded. Moreover, by a predetermined operation, the image pick-up signal stored in the memory of the circuit board 2208 is output into the television monitor 2300 or the personal computer 2400.

(2) Portable Telephone, Other Electronic Devices

FIGS. 15(A), (B), and (C) are perspective views of other electronic devices using the liquid crystal display as the electro-optical apparatus according to the present invention. FIG. 15(A) shows a portable telephone 4000 having the liquid crystal display 1100 on the upper front surface; FIG. 15(B) shows a wrist watch 5000 having a display on the central front surface of a body using the liquid crystal display 1100; FIG. 15(C) shows a portable information device 6000 having a display formed of the liquid crystal display 1100 and an input section 5100.

These electronic devices, other than the liquid crystal display 1100, although not shown, include various circuits, such as a display-information-output source, display-information-processing circuit, and a clock-generating circuit, and a display-signal generating section including a power supply circuit to supply electric power to these circuits. In the case of the portable information device 6000, for example, a display signal generated by the display-signal generating section based on the information input from the input section 5100 is supplied to the display so as to form display images.

Examples of various electronic devices in which the color liquid-crystal display 1100 according to the present invention is assembled, other than the digital still camera, portable telephone, wrist watch, and portable information device, include an electronic pocketbook, pager, POS-terminal, IC card, mini-disk player, liquid crystal projector, personal computer (PC) applicable to multi-media, engineering work station (EWS), notebook personal computer, word processor, television, view-finder type or monitor-straight-gaze type video-tape-recorder, electronic desk-top calculator, car navigation apparatus, apparatus having a touch panel, and clock.

In addition, in the liquid crystal display panel, when classifying by the driving system, a simple matrix-liquid-crystal display panel using no switching element in the panel itself, static drive liquid-crystal display panel, three-terminal switching element represented by the TFT (thin film transistor), and active-matrix liquid-crystal display panel using two-terminal switching element represented by the TFD (thin film diode) can be used. When classifying by electro-optical characteristics, various types of liquid-crystal display panels, such as a TN type, STN type, guest-host type, phase-transition type, and ferroelectric type, can be used.

The apparatus according to the present invention has been described by exemplifying several embodiments; however, the present invention may be modified in various ways within the spirit and scope of the invention. For example, in the embodiment described above, the liquid-crystal display and EL display are described as image displaying devices (electro-optical display) of the electro-optical apparatus; however, the present invention is not limited to these apparatuses, and various electro-optical devices can be used, such as a thin-thickness cathode-ray-tube, compact television using a liquid crystal shutter, electroluminescence, plasma display, CRT display, FED (field emission display) panel, and electrophoresis display, for example.

What is claimed is:

1. A color display substrate, comprising:
   a plurality of color display elements arranged in a matrix pattern;
   a plurality of pixels that constitute each of the plurality of color display elements;
   a colored layer that includes a plurality of color dots that constitute each of the plurality of pixels, the plurality of color dots having a first dot pitch in a direction perpendicular to a first base line, and each of the plurality of color dots being located at a distance of at least substantially an integral multiple of the first dot pitch from the first base line; and
   a spacing between color display elements, the spacing between the color display elements being substantially an integral multiple of the first dot pitch in a direction of a second base line perpendicular to the first base line.

2. The substrate according to claim 1, the color dots of the color display elements being further located at a distance of substantially an integral multiple of a second dot pitch in a direction of the first base line.

3. The color display substrate according to claim 2, the spacing between the color display elements being substantially an integral multiple greater than one of the second dot pitch in the direction of the first base line while being substantially an integral multiple greater than one of the first dot pitch in the direction of the second base line.

4. The color display substrate according to claim 3, the arrangement of the color display elements being substantially an integral multiple greater than one of the second dot pitch in the direction of the first base line while being substantially an integral multiple greater than one of the first dot pitch in the direction of the second base line.

5. The color display substrate according to claim 1, the arrangement of the pixels of the color display elements being any one of a stripe type, a mosaic type, a delta type, and a square type.

6. The color display substrate according to claim 1, the color dots being formed of liquid droplets ejected from nozzles.

7. The color display substrate according to claim 1, the color dots including a color display layer and a bank layer to lay out the colored layer.

8. An electro-optical apparatus, comprising:
a color indicator obtained from the color display substrate according to claim 1.

9. An electronic device, comprising:
the electro-optical apparatus according to claim 8.

10. The substrate according to claim 1, wherein the substrate is a component within a liquid crystal display.

11. The substrate according to claim 1, wherein the colored layer does not include a liquid crystal material.

12. A color filter substrate, comprising:
a plurality of color filter elements arranged in a matrix pattern;
a plurality of pixels that constitute each of the plurality of color filter elements;
a colored layer that includes a plurality of color dots that constitute each of the plurality of pixels, the plurality of color dots having a first dot pitch in a direction perpendicular to a first base line, and each of the plurality of color dots being located at a distance of at least substantially an integral multiple of the first dot pitch from the first base line; and
a spacing between color filter elements, the spacing between the color filter elements being substantially an integral multiple of the first dot pitch in a direction of a second base line perpendicular to the first base line.

13. The color filter substrate according to claim 12, the color dots of the color filter elements being located at a distance of substantially an integral multiple of a second dot pitch in a direction of the first base line.

14. The color filter substrate according to claim 13, the spacing between the color filter elements being substantially an integral multiple greater than one of the second dot pitch in the direction of the first base line while being substantially an integral multiple greater than one of the first dot pitch in the direction of the second base line.

15. The color filter substrate according to claim 14, the arrangement of the color filter elements being substantially an integral multiple greater than one of the second dot pitch in the direction of the first base line while being substantially an integral multiple greater than one of the first dot pitch in the direction of the second base line.

16. The color filter substrate according to claim 12, the color dots being formed of liquid droplets ejected from nozzles.

17. The color filter substrate according to claim 16, the color dots including a color display layer and a bank layer to lay out the colored layer.

18. An electro-optical apparatus, comprising:
a color filter obtained from the color filter substrate according to claim 12;
an opposing substrate arranged at a predetermined distance from the color filter; and
an electro-optical material layer placed between the color filter and the opposing substrate.

19. The electro-optical apparatus according to claim 18, the electro-optical material layer being a liquid-crystal material layer.

20. The color filter substrate according to claim 12, wherein the substrate is a component within a liquid crystal display.

21. The color filter substrate according to claim 12, wherein the colored layer does not include a liquid crystal material.

22. A color luminescent substrate, comprising:
a plurality of color luminescent elements arranged in a matrix pattern;
a plurality of pixels that constitute each of the plurality of color luminescent elements;
a colored layer that includes a plurality of color dots that constitute each of the plurality of pixels, the plurality of color dots having a first dot pitch in a direction perpendicular to a first base line, and each of the plurality of color dots being located at a distance of at least substantially an integral multiple of the first dot pitch from the first base line;
a spacing between color luminescent elements, the spacing between the color luminescent elements being substantially an integral multiple of the first dot pitch in a direction of a second base line perpendicular to the first base line.

23. The color luminescent substrate according to claim 22, the color dots of the color luminescent elements being located at a distance of substantially an integral multiple of a second dot pitch in a direction of the first base line.

24. The color luminescent substrate according to claim 23, the spacing between the color luminescent elements being substantially an integral multiple greater than one of the second dot pitch in the direction of the first base line while being substantially an integral multiple greater than one of the first dot pitch in the direction of the second base line.

25. The color luminescent substrate according to claim 24, the arrangement of the color luminescent elements being substantially an integral multiple greater than one of the second dot pitch in the direction of the first base line while being substantially an integral multiple greater than one of the first dot pitch in the direction of the second base line.

26. The color luminescent substrate according to claim 22, the color dots being formed of liquid droplets ejected from nozzles.

27. The color luminescent substrate according to claim 26, the color dots including a color display layer and a bank layer to lay out the colored layer.

28. The color luminescent substrate according to claim 27, the color luminescent elements including an electroluminescence material.

29. An electro-optical apparatus, comprising:
a color illuminator obtained from the color luminescent substrate according to claim 22.

30. The color luminescent substrate according to claim 22, wherein the substrate is a component within a liquid crystal display.

31. The color luminescent substrate according to claim 22, wherein the colored layer does not include a liquid crystal material.

32. A method for manufacturing a display substrate, comprising:
   arranging a plurality of color elements in a matrix pattern;
   arranging a plurality of pixels to constitute each of the plurality of color elements;
   arranging a plurality of color dots within a colored layer of the display substrate to constitute each of the plurality of pixels, the plurality of color dots having a first dot pitch in a direction perpendicular to a first base line, and each of the plurality of color dots being located at a distance of at least substantially an integral multiple of the first dot pitch from the first base line; and
   arranging a spacing between the color elements that is substantially an integral multiple of the first dot pitch in a direction of a second base line perpendicular to the first base line.

33. The method according to claim 32, further including locating the region where the color dots are formed of the color display element at a distance of substantially an integral multiple of a second dot pitch in a direction of the first base line.

34. The method according to claim 33, further including providing the spacing between the color elements to be substantially an integral multiple greater than one of the second dot pitch in the direction of the first base line while being substantially an integral multiple greater than one of the first dot pitch in the direction of the second base line.

35. The method according to claim 34, further including providing the arrangement of the color elements to be substantially an integral multiple greater than one of a second element pitch in the direction of the first base line while being substantially an integral multiple greater than one of a first element pitch in the direction of the second base line.

36. The method according to claim 32, further including, in the color elements, providing the arrangement of the pixels of the color elements to be any one of a stripe type, a mosaic type, a delta type, and a square type.

37. The method according to claim 32, further including:
   forming a bank layer to lay out a color display layer of the color dots; and
   supplying liquid droplets to a region laid out by the bank layer.

38. The method according to claim 37, further including providing the color display layer to include the colored layer.

39. The method according to claim 37, further including providing the color display layer to include a luminescent layer.

40. The method according to claim 39, further including providing the luminescent layer to include an electroluminescence material.

41. The method according to claim 32, further including:
   ejecting liquid droplets from a head having a nozzle array having a plurality of nozzles, which are arranged linearly so as to have a predetermined pitch in the direction of the first base line; and
   wherein the nozzle array has an effective nozzle-array length including a plurality of regions where the color elements are formed.

42. The method according to claim 41, further including, in the nozzle array, providing the effective nozzle-array length in the direction of the first base line to be substantially an integral multiple greater than one of the second element pitch of the color elements.

43. The method according to claim 32, further including providing the color elements to include a color filter element.

44. The method according to claim 32, further including providing the color elements to include a color luminescent element.

45. The method of claim 32, wherein arranging the plurality of color dots further comprises:
   forming the plurality of color dots by selectively ejecting liquid droplets from at least one nozzle in accordance with input data.

46. The method according to claim 32, further comprising:
   including the substrate in a liquid crystal display.

47. The method according to claim 32, wherein the colored layer does not include a liquid crystal material.

48. A motherboard for a display, comprising:
   a plurality of units, each of the units constituting the display;
   a plurality of dot elements arranged in a line, the plurality of dot elements being arranged within a colored layer within each of the units in a predetermined direction at a first dot pitch, and one of the plurality of dot elements included in each one of the units and one of the plurality of dot elements included in another unit being arranged at a distance of substantially an integral multiple of the first dot pitch in the predetermined direction; and
   a spacing between units, the spacing between the units being substantially an integral multiple of the first dot pitch in the predetermined direction.

49. The motherboard according to claim 48, the dot elements being arranged within each of the units in a direction perpendicular to the predetermined direction at a second dot pitch, and
   one of the plurality of dot elements included in each one of the units and one of the plurality of dot elements included in the other of the units being arranged at a distance of substantially an integral multiple greater than one of the second dot pitch in the direction perpendicular to the predetermined direction.

50. The motherboard according to claim 48, wherein the motherboard is a component within a liquid crystal display.

51. The motherboard according to claim 48, wherein the colored layer does not include a liquid crystal material.

52. A motherboard for a display, comprising:
   a plurality of units, each of the units constituting the display;
   a plurality of pixels that constitute each of the plurality of units; and
   a plurality of dot elements within a colored layer that constitute each of the plurality of pixels, the plurality of dot elements having a first dot pitch in a direction perpendicular to a first base line, and each of the plurality of dot elements being located at a distance of at least substantially an integral multiple of the first dot pitch from the first base line,
   wherein the spacing between the plurality of units being substantially an integral multiple of the first dot pitch in a direction of a second base line perpendicular to the first base line.

53. The motherboard according to claim 52, each of the plurality of dot elements being located at a distance of substantially an integral multiple of a second dot pitch in a direction of the first base line.

54. The motherboard according to claim 53, the spacing between the plurality of units being an integral multiple greater than one of the second dot pitch in the direction of the first base line while being an integral multiple greater than one of the first dot pitch in the direction of the second base line.

55. The motherboard according to claim 54, the arrangement of the plurality of units being an integral multiple greater than one of the second dot pitch in the direction of the first base line while being an integral multiple greater than one of the first dot pitch in the direction of the second base line.

56. The motherboard according to claim 52, wherein the motherboard is a component within a liquid crystal display.

57. The motherboard according to claim 52, wherein the colored layer does not include a liquid crystal material.

58. A display substrate, comprising:
a plurality of color elements arranged in a matrix pattern;
a plurality of pixels that constitute each of the plurality of color elements; and
a colored layer that includes a plurality of color dots that constitute each of the plurality of pixels, the plurality of color dots having a first dot pitch in a direction perpendicular to a first base line, and each of the plurality of color dots being located at a distance of at least substantially an integral multiple of the first dot pitch from the first base line; and
a spacing between color elements, the spacing between the color elements being substantially an integral multiple of the first dot pitch in a direction of a second base line perpendicular to the first base line.

59. The display substrate of claim 58 wherein the display substrate is at least one of:
a color display substrate;
a color luminescent substrate; and
a color filter substrate.

60. The display substrate of claim 58, wherein the substrate is a component within a liquid crystal display.

61. The display substrate of claim 58, wherein the colored layer does not include a liquid crystal material.

* * * * *